US011417559B2

(12) United States Patent
Kim et al.

(10) Patent No.: US 11,417,559 B2
(45) Date of Patent: Aug. 16, 2022

(54) METHOD OF MANUFACTURING SEMICONDUCTOR PACKAGE

(71) Applicant: SAMSUNG ELECTRONICS CO., LTD., Suwon-si (KR)

(72) Inventors: Yeonga Kim, Hwaseong-si (KR); Seonho Lee, Cheonan-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/111,758

(22) Filed: Dec. 4, 2020

(65) Prior Publication Data

US 2021/0343569 A1 Nov. 4, 2021

(30) Foreign Application Priority Data

May 4, 2020 (KR) ........................ 10-2020-0053389

(51) Int. Cl.
*H01L 21/683* (2006.01)
*H01L 21/56* (2006.01)
*H01L 23/31* (2006.01)

(52) U.S. Cl.
CPC ........ *H01L 21/6835* (2013.01); *H01L 21/568* (2013.01); *H01L 23/3128* (2013.01); *H01L 2221/68359* (2013.01); *H01L 2221/68386* (2013.01)

(58) Field of Classification Search
CPC ............... H01L 21/6835; H01L 21/568; H01L 23/3128; H01L 2221/68359; H01L 2221/68386
USPC ........................................................ 438/110
See application file for complete search history.

(56) References Cited

U.S. PATENT DOCUMENTS

| | | | | |
|---|---|---|---|---|
| 5,476,566 | A | 12/1995 | Cavasin | |
| 7,052,934 | B2 * | 5/2006 | Kurimoto | H01L 21/6835 438/106 |
| 8,779,599 | B2 * | 7/2014 | Lin | H01L 24/94 257/774 |
| 9,668,351 | B2 | 5/2017 | Wang | |
| 10,134,627 | B2 | 11/2018 | Costa | |
| 2012/0094418 | A1 | 4/2012 | Grama et al. | |
| 2017/0294550 | A1 | 10/2017 | Cheng et al. | |

FOREIGN PATENT DOCUMENTS

| | | | |
|---|---|---|---|
| KR | 100209263 | B1 | 7/1999 |
| KR | 101084439 | B1 | 11/2011 |
| KR | 101276487 | B1 | 6/2013 |
| KR | 101394173 | B1 | 5/2014 |
| KR | 101617316 | B1 | 5/2016 |

* cited by examiner

*Primary Examiner* — Vu A Vu
(74) *Attorney, Agent, or Firm* — Myers Bigel, P.A.

(57) ABSTRACT

To manufacture a semiconductor package, a package intermediate structure having an element area and a dummy area is formed. A carrier substrate including an adhesion layer is formed. The adhesion layer includes a first area with a first adhesion strength and a second area with a second adhesion strength that is different from the first adhesion strength. The package intermediate structure is supported by the carrier substrate so that the element area is adjacent the first area and the dummy area is adjacent the second area. The package intermediate structure is processed while the package intermediate structure is supported by the carrier substrate.

18 Claims, 23 Drawing Sheets

X3-X3'

METHOD OF MANUFACTURING SEMICONDUCTOR PACKAGE

CROSS-REFERENCE TO RELATED APPLICATION

This application claims the benefit of Korean Patent Application No. 10-2020-0053389, filed on May 4, 2020 in the Korean Intellectual Property Office, the disclosure of which is incorporated herein in its entirety by reference.

FIELD

The technical idea of the inventive concept relates to a method of manufacturing a semiconductor package, and more particularly, to a method of manufacturing a semiconductor package using a carrier substrate.

BACKGROUND

In a semiconductor package manufacturing process, a package intermediate structure including a plurality of semiconductor chips is formed, and various semiconductor package manufacturing processes, such as a redistribution layer forming process, are performed on the package intermediate structure. In this case, a warpage phenomenon in which the package intermediate structure is bent may occur due to a difference in a thermal expansion coefficient between individual components of the package intermediate structure. Accordingly, it is necessary to develop a process capable of suppressing the warpage phenomenon of the package intermediate structure in the manufacturing process of the semiconductor package.

SUMMARY

The inventive concept provides a method of manufacturing a semiconductor package that may effectively suppress a warpage phenomenon of a package intermediate structure in the manufacturing process of the semiconductor package.

According to some embodiments of the inventive concept, in a method of manufacturing a semiconductor package, a package intermediate structure having an element area and a dummy area is formed. A carrier substrate including an adhesion layer including a first area with a first adhesion strength and a second area having a second adhesion strength that is different from the first adhesion strength is formed. The package intermediate structure is supported by the carrier substrate by contacting the package intermediate structure to the adhesion layer so that the element area is adjacent the first area and the dummy area is adjacent the second area. The package intermediate structure is processed while the package intermediate structure is supported by the carrier substrate to reduce warpage of the package intermediate structure.

According to some embodiments of the inventive concept, in a method of manufacturing a semiconductor package, a package intermediate structure including a plurality of element areas and a dummy area around ones of the plurality of element areas is formed. A carrier substrate including a support substrate and an adhesion layer on the support substrate is formed. The adhesion layer includes a plurality of first areas with a first adhesion strength and a second area with a second adhesion strength, where the second adhesion strength is greater than the first adhesion strength. The package intermediate structure is supported by the carrier substrate by contacting the package intermediate structure to the adhesion layer so that the plurality of element areas are adjacent the plurality of first areas and the dummy area is adjacent the second area. The package intermediate structure is processed to form a package structure while the package intermediate structure is supported by the carrier substrate.

According to some embodiments of the inventive concept, in a method of manufacturing a semiconductor package, a photosensitive film is formed on a support substrate. A partial area of the photosensitive film is exposed to UV light to form an adhesion layer including a first area including the exposed area of the photosensitive film and a second area including a non-exposed area of the photosensitive film. A package intermediate structure including an element area and a dummy area is adhered to the adhesion layer so that the element area is adjacent the first area and the dummy area is adjacent the second area. A package structure is formed from the package intermediate structure by forming a backside structure on the package intermediate structure while the package intermediate structure is supported by the support substrate and the adhesion layer. The package structure and the adhesion layer are cut to remove the dummy area from the package structure while the adhesion layer is adhered to the device area and the dummy area. The adhesion layer is removed from the element area.

BRIEF DESCRIPTION OF THE DRAWINGS

Embodiments of the inventive concept will be more clearly understood from the following detailed description taken in conjunction with the accompanying drawings in which:

FIG. 3A is a plan view illustrating an enlarged local area in the element area, and FIG. 3B is an enlarged cross-sectional view of some components taken along line X3-X3' in FIG. 3A;

DETAILED DESCRIPTION

Figure 1:
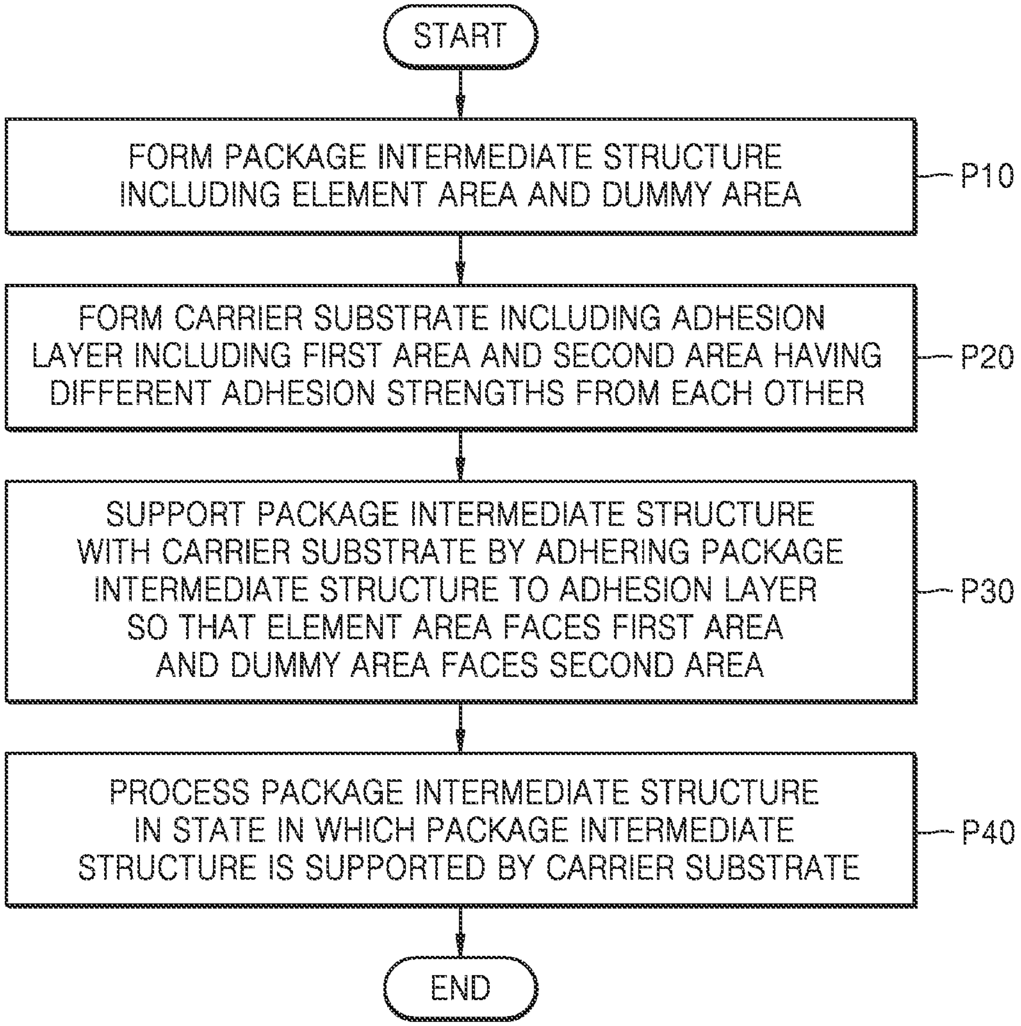
FIG. 1 is a flowchart of a method of manufacturing a semiconductor package, according to some embodiments of the inventive concept.

Hereinafter, embodiments of the inventive concept will be described in detail with reference to the accompanying drawings. Identical reference numerals are used for the same constituent devices in the drawings, and a duplicate description thereof will be omitted.

FIG. 1 is a flowchart of a method of manufacturing a semiconductor package, according to some embodiments of the inventive concept.

Referring to FIG. 1, a package intermediate structure including an element area and a dummy area may be formed in a process P10.

Figure 2:
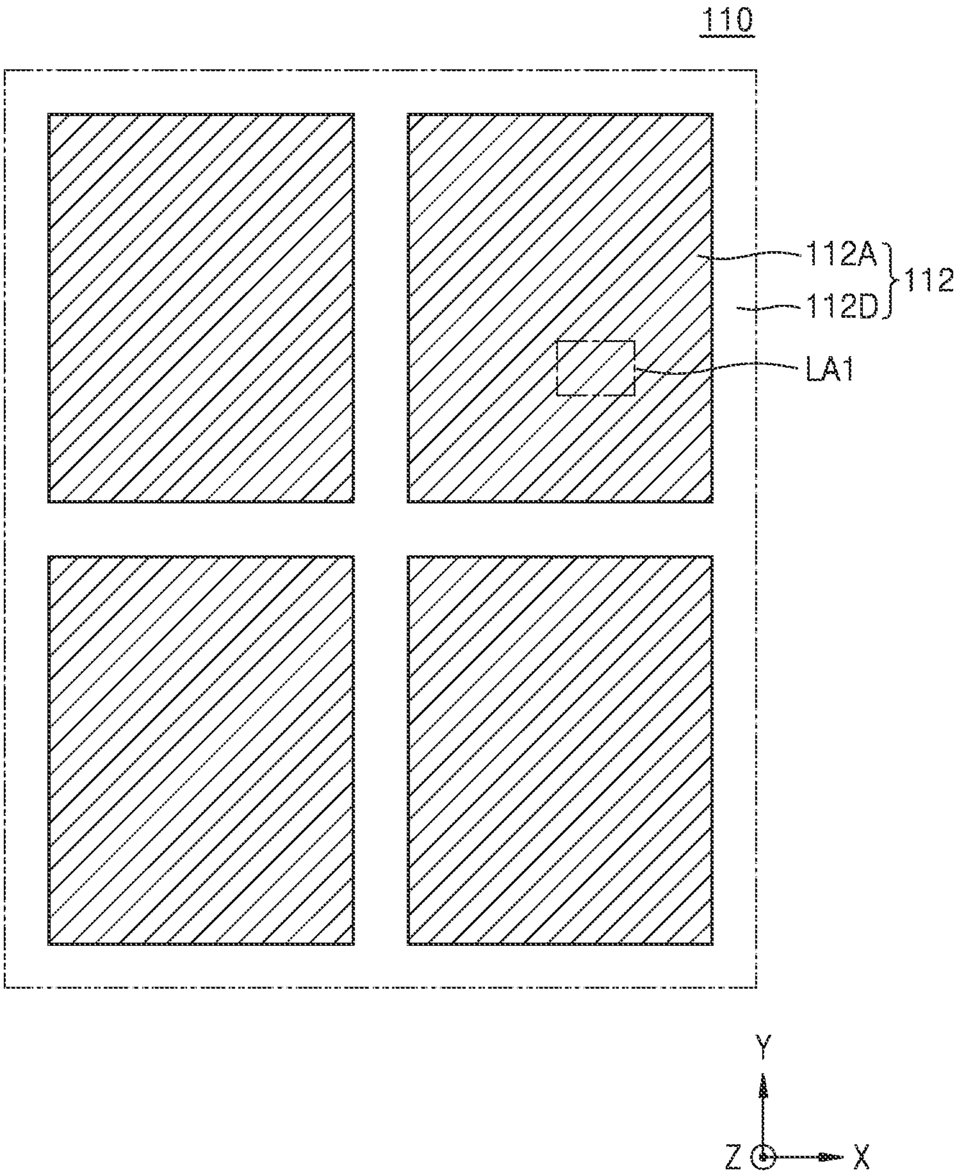
FIG. 2 is a plan view illustrating an example configuration of a package intermediate structure formed according to a method of manufacturing a semiconductor package, according to some embodiments of the inventive concept.

FIG. 2 is a plan view illustrating an example configuration of a package intermediate structure 110 formed according to a method of manufacturing a semiconductor package, according to some embodiments of the inventive concept. The package intermediate structure 110 illustrated in FIG. 2 may be formed in the process P10 of FIG. 1.

Referring to FIG. 2, the package intermediate structure 110 may include a panel 112 including a plurality of element areas 112A and a dummy area 112D adjacent to the plurality of element areas 112A. The dummy area 112D may surround a periphery of each of the plurality of element areas 112A.

The package intermediate structure 110 may have a rectangular or square flat plate shape in a plan view. The plurality of element areas 112A may be arranged in a matrix form in the panel 112 of the package intermediate structure 110. The dummy area 112D may have a square grid mesh-shaped unit and may be around or surround a plurality of element areas 112A of the panels 112 of the package intermediate structure 110. However, according to the technical idea of the inventive concept, a planar shape of each of the package intermediate structure 110 and the plurality of element areas 112A is not limited to that illustrated in FIG. 2. The planar shape of each of the package intermediate structure 110 and the plurality of element areas 112A may be variously configured, such as polygonal or elliptical.

Figure 3A:
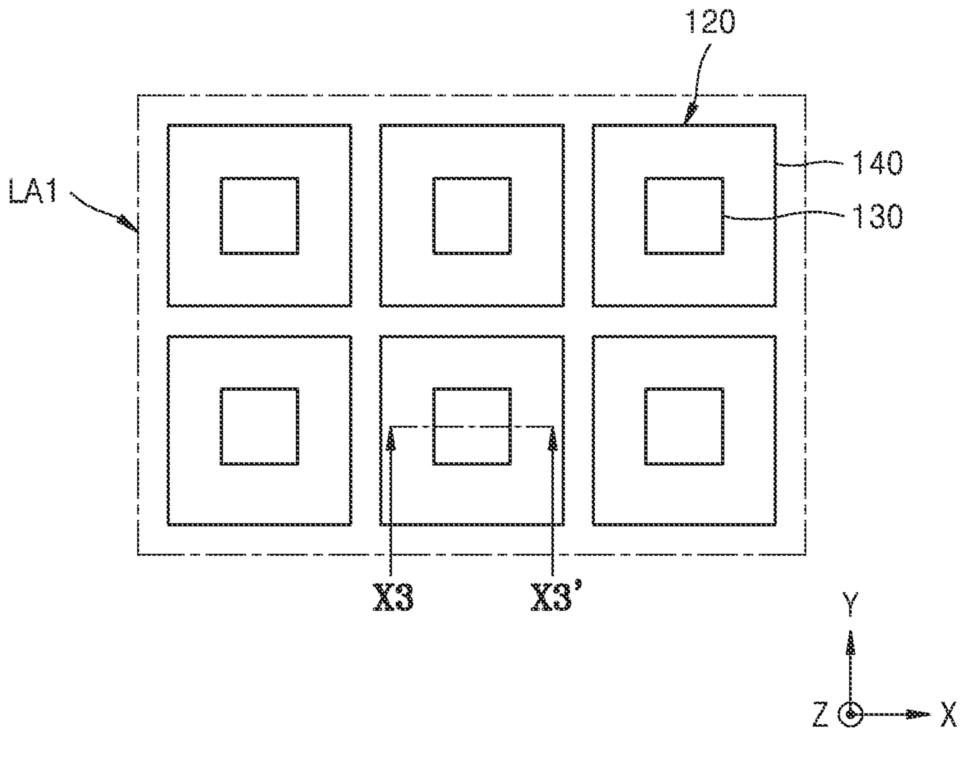
FIGS. 3A and 3B are diagrams for explaining in more detail configurations of an element area among a package intermediate structure formed according to a method of manufacturing a semiconductor package, according to embodiments of the inventive concept, where
Figure 3B:
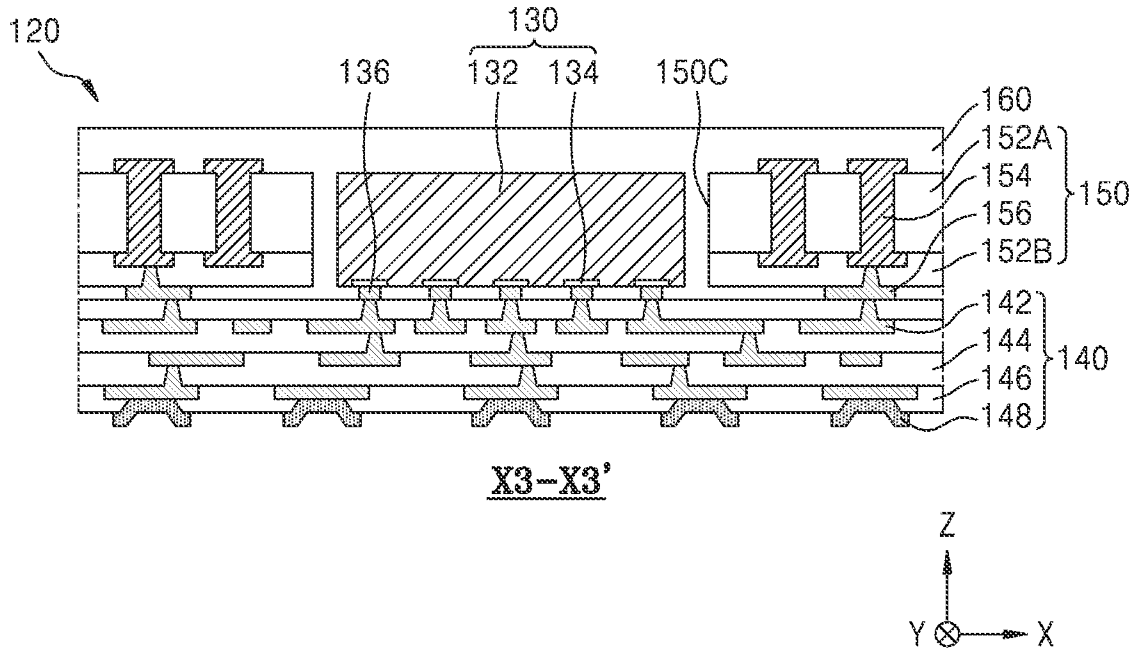

FIGS. 3A and 3B are diagrams for explaining the configuration of the element area 112A in more detail in the package intermediate structure 110 illustrated in FIG. 2. FIG. 3A is an enlarged plan view of a local area LA1 among the element areas 112A, and FIG. 3B is an enlarged cross-sectional view of some components taken along line X3-X3' in FIG. 3A.

Referring to FIGS. 3A and 3B, the element area 112A of the package intermediate structure 110 may include a plurality of unit packages 120. The plurality of unit packages 120 may include circuit substrates 150 each having a cavity 150C, a semiconductor chip 130 accommodated in the cavity 150C of a circuit substrate 150, and a redistribution layer 140 overlapping the semiconductor chip 130 in a vertical direction (Z direction). The redistribution layer 140 may be configured to be electrically connected to the semiconductor chip 130.

The plurality of unit packages 120 may be part of a fan-out semiconductor package. The fan-out semiconductor package may have a structure in which input/output terminals are redistributed to peripheral areas having a larger size than the semiconductor chip 130 via connecting members formed on the semiconductor chip 130.

In a plane view (for example, an X-Y plane in FIG. 3A or FIG. 3B), the circuit substrate 150 may surround the semiconductor chip 130. The circuit substrate 150 may have an embedded trace substrate (ETS) structure in which a circuit pattern is embedded in an insulating layer. In example embodiments, the dummy area 112D of the package intermediate structure 110 illustrated in FIG. 2 may be a partial area of the circuit substrate 150.

Figure 10:
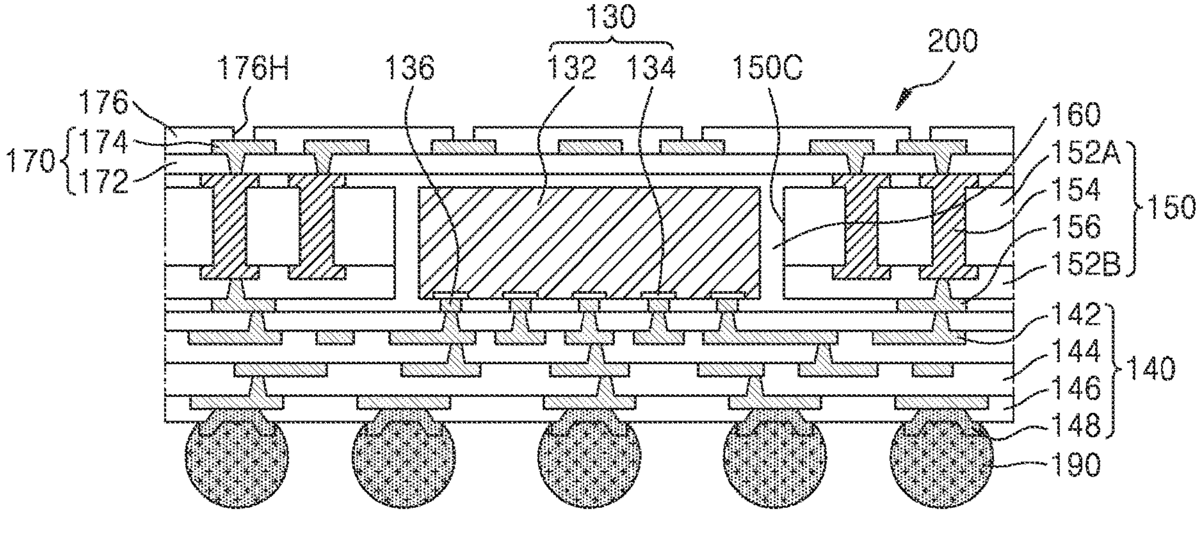
FIG. 10 is a cross-sectional view illustrating a package structure formed according to a method of manufacturing a semiconductor package, according to some embodiments of the inventive concept.

The redistribution layer 140 may be configured so that a connection between the semiconductor chip 130 and external connection terminals (for example, a plurality of external connection terminals 190 illustrated in FIG. 10) to be formed in a subsequent process, a connection between the semiconductor chip 130 and the circuit substrate 150, and a connection between the circuit substrate 150 and the external connection terminals are possible.

The redistribution layer 140 may include a plurality of conductive patterns 142 having a multi-layer structure and a plurality of insulating layers 144 for mutually insulating some adjacent conductive patterns 142 among the plurality of conductive patterns 142. The plurality of conductive patterns 142 may provide an electrical path connecting the semiconductor chip 130 to the external connection terminals, an electrical path connecting the semiconductor chip 130 to the circuit substrate 150, and an electrical path connecting the circuit substrate 150 to the external connection terminals. In example embodiments, the redistribution layer 140 may further include a protection layer 146 and a plurality of conductive pads 148 that penetrate the protective layer 146 and are respectively connected to the plurality of conductive patterns 142.

In example embodiments, the plurality of conductive patterns 142 and the plurality of conductive pads 148 may include copper (Cu), gold (Au), silver (Ag), nickel (Ni), tungsten (W), aluminum (Al), or a combination thereof. Each of the plurality of conductive patterns 142 and the plurality of conductive pads 148 may further include a barrier layer. The barrier layer may include titanium (Ti), tantalum (Ta), titanium nitride (TiN), tantalum nitride (TaN), or a combination thereof.

In example embodiments, the plurality of insulation layers 144 may include an inorganic insulating material, an organic insulating material, or a combination thereof. The inorganic insulating material may include silicon oxide, silicon nitride, or a combination thereof. The organic insulating material may include polyimide, epoxy resin, or a combination thereof.

The protection layer 146 may be provided to protect the plurality of conductive patterns 142 of the redistribution layer 140 from the surrounding environment, and include a composite material including a matrix and a filler inside of the matrix. The matrix may include a polymer, and the filler may include silica, titania, or a combination thereof.

In example embodiments, the plurality of conductive pads 148 may further include additives for improving wettability with the external connection terminals (for example, the plurality of external connection terminals 190 illustrated in FIG. 10) to be formed in a subsequent process. The additives may be selected from Ni, Au, or a combination thereof.

The semiconductor chip 130 may include a body 132 and a plurality of chip pads 134. The body 132 may include a substrate and an integrated circuit on the substrate. The substrate may include a semiconductor substrate. The integrated circuit may include a memory circuit, a logic circuit, or a combination thereof. The memory circuit may include dynamic random access memory (DRAM), static RAM (SRAM), flash memory, electrically erasable and programmable read-only memory (EEPROM), phase-change RAM (PRAM), magnetic RAM (MRAM), resistive RAM (RRAM), or a combination thereof, but is not limited thereto. The logic circuit may include a central processing unit (CPU), a graphics processing unit (GPU), a controller, an application specific integrated circuit (ASIC), an application processor (AP), or a combination thereof, but is not limited thereto.

The integrated circuit included in the semiconductor chip 130 may be connected to the redistribution layer 140 via the chip pad 134 and a metal bump 136. The chip pad 134 of the semiconductor chip 130 may be electrically connected to an upper structure, for example, a backside structure 270 illustrated in FIG. 7 or a backside redistribution layer 170 of FIGS. 8B to 8D via the metal bump 136, the redistribution layer 140, and the circuit substrate 150. The chip pad 134 may include Cu, Au, Ag, Ni, W, Al, or a combination thereof. The metal bump 136 may include a low melting point metal such as Cu, Sn—Au—Cu. In example embodiments, the metal bump 136 may be omitted, and in this case, the chip pad 134 of the semiconductor chip 130 may be directly connected to the conductive pattern 142 of the redistribution layer 140.

The circuit substrate 150 may include a plurality of insulating layers 152A and 152B, a plurality of via contact structures 154 penetrating the insulating layer 152A and extending in a vertical direction (Z direction), and a plurality of conductive patterns 156 configured to be connected to some via contact structures 154 among the plurality of via contact structures 154. The plurality of via contact structures 154 and the plurality of conductive patterns 156 may provide an electrical path between the redistribution layer 140 and the upper structure formed in a subsequent process, for example, the backside structure 270 illustrated in FIG. 7 or the backside redistribution layer 170 illustrated in FIG. 8D. FIG. 3B illustrates the case in which each of the plurality of via contact structures 154 includes one via contact penetrating the insulating layers 152A, but the technical spirit of the inventive concept is not limited thereto. For example, at least some of the plurality of via contact structures 154 may be replaced with a structure in which a plurality of via contacts penetrating some of the insulating layer 152A are connected in a line in the vertical direction (Z direction).

In example embodiments, the insulating layers 152A and 152B may include at least one material of thermosetting resin such as epoxy resin, thermoplastic resin such as polyimide, prepreg, Ajinomoto build-up film (ABF), FR-4, and Bismaleimide Triazine (BT). The plurality of via contact structures 154 and the plurality of conductive patterns 156 may include Cu, Au, Ag, Ni, W, Al, or a combination thereof. The plurality of via contact structures 154 and the plurality of conductive patterns 156 may further include the barrier layer. The barrier layer may include Ti, Ta, TiN, TaN, or a combination thereof.

The semiconductor chip 130 and the circuit substrate 150 may be covered with or overlapped by a sealing layer 160 that is on the semiconductor chip 130 and/or the circuit substrate 150. The sealing layer 160 may fill a space between the semiconductor chip 130 and the circuit substrate 150, and a space between the semiconductor chip 130 and the redistribution layer 140. The sealing layer 160 may include thermosetting resin such as epoxy resin or thermoplastic resin such as polyimide. In example embodiments, the sealing layer 160 may include a molding material such as epoxy mold compound (EMC) or a photosensitive material such as photo imageable encapsulant (PIE). In example embodiments, the sealing layer 160 may include a matrix and a composite material including a filler in the matrix. The matrix may include a polymer. The filler may include silica, titania, or combinations thereof.

Referring again to FIG. 1, a carrier substrate including an adhesion layer may be formed in a process P20. The adhesion layer may include a first area and a second area which are on one plane and have different adhesion strengths from each other. In example embodiments, the first area may have a first adhesion strength, and the second area may have a second adhesion strength, the second adhesion strength being greater than the first adhesion strength.

Figure 4A:
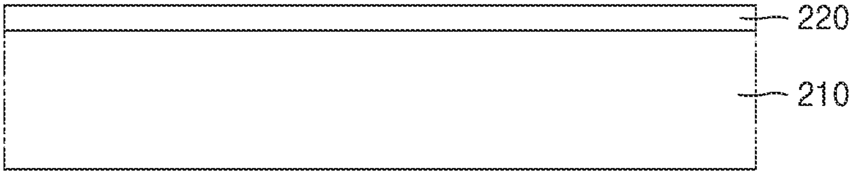
FIGS. 4A and 4B are cross-sectional views illustrating an example process of forming a carrier substrate according to a method of manufacturing a semiconductor package, according to embodiments of the inventive concept.
Figure 4B:
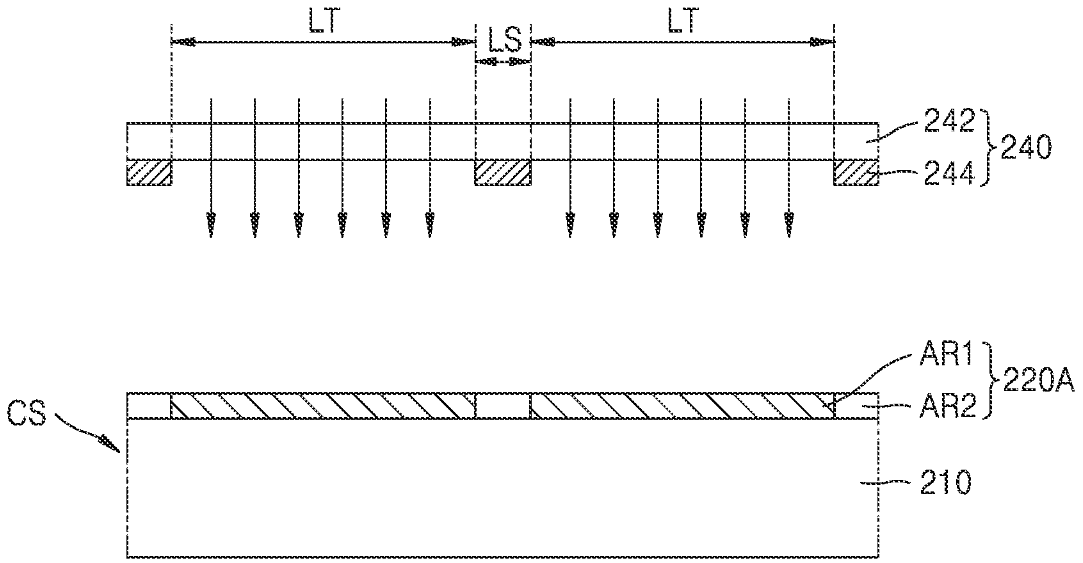

FIGS. 4A and 4B are cross-sectional views illustrating an example process of forming the carrier substrate CS according to a method of manufacturing a semiconductor package according to the process order, according to embodiments of the inventive concept. In the process P20 of FIG. 1, the carrier substrate CS may be formed according to a method described with reference to FIGS. 4A and 4B.

Referring to FIG. 4A, a photosensitive film 220 may be formed on a support substrate 210.

The support substrate 210 may have a multi-layer structure. In example embodiments, the support substrate 210 may include a release layer, a metal layer, and/or the like so that the support substrate 210 is easily removed from a support object.

Figure 5A:
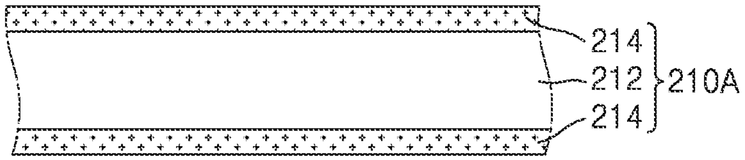
FIGS. 5A and 5B are cross-sectional views illustrating example structures usable as support substrates of a carrier substrate in a method of manufacturing a semiconductor package, according to embodiments of the inventive concept.
Figure 5B:
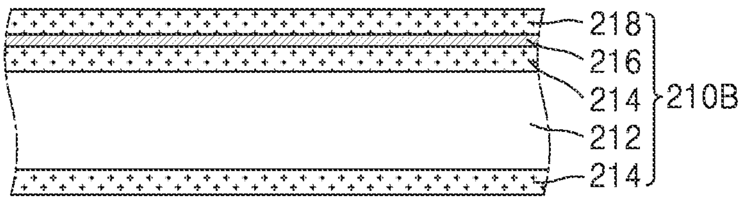

FIGS. 5A and 5B are cross-sectional views illustrating example structures of support substrates 210A and 210B usable as the support substrate 210 illustrated in FIG. 4A, respectively.

Referring to FIG. 5A, the support substrate 210A may have a copper clad laminated (CCL) structure including a core insulating layer 212 and a copper layer 214 covering or on both surfaces of the core insulating layer 212.

In example embodiments, the core insulating layer 212 may include a flexible material such as polyimide (PI), or a rigid material using a mixed material such as glass fiber, bismaleimide triazine (BT), epoxy resin, and phenol resin. For example, the core insulating layer 212 may include a prepreg in a semi-cured state including epoxy resin and glass fiber.

Referring to FIG. 5B, the support substrate 210B may, as described with reference to FIG. 5A, include a detach core film (DCF) structure including a core insulating layer 212, a copper clad laminated (CCL) structure including the copper layers 214 covering or on both surfaces of the core insulating layer 212, the release layer 216 covering or on the copper layer 214 of the CCL structure, and a metal layer 218 covering or on the release layer 216.

A type of the metal layer 218 is not particularly limited as long as the metal layer includes a metal thin layer including a conductive material used to form a circuit pattern in the art.

For example, the metal layer 218 may include chromium (Cr), nickel (Ni), zinc (Zn), molybdenum (Mo), tungsten (W), cobalt (Co), lead (Pb), silver (Ag), tantalum (Ta), copper (Cu), aluminum (Al), manganese (Mn), iron (Fe), titanium (Ti), tin (Sn), steel (steel), zinc (Zn) and vanadium (V), palladium (Pd), a mixture thereof, or an alloy thereof.

The release layer 216 may be separated from the metal layer 218 by an external force. The release layer 216 may include a different metal from the constituent material of the metal layer 218. The release layer 216 may include a metal having a relatively weak reactivity with the metal layer 218. In example embodiments, the release layer 216 may include chromium (Cr), nickel (Ni), zinc (Zn), molybdenum (Mo), tungsten (W), cobalt (Co), lead (Pb), silver (Ag), tantalum (Ta), copper (Cu), aluminum (Al), manganese (Mn), iron (Fe), titanium (Ti), tin (Sn), steel, vanadium (V), or a combination thereof. For example, when the metal layer 218 includes copper (Cu), the release layer 216 may include chromium (Cr) or nickel (Ni).

Referring again to FIG. 4A, to form the photosensitive layer 220 on the support substrate 210, photocurable composition may be coated on the support substrate 210.

The photocurable composition may include a material curable by light. For example, the photocurable composition may include a material that causes a photo polymerization reaction by ultraviolet irradiation.

In example embodiments, the photocurable composition may include a polydimethylsiloxane (PDMS)-based compound and an acrylate-based photocurable compound.

The PDMS-based compound may provide flexibility, flowability, and adhesion properties of the photosensitive film 220. In example embodiments, the PDMS-based compound may include methyl-terminated PDMS, a monohydride-terminated PDMS (H-PDMS), the PDMS including a reactive functional group, or a combination thereof. The reactive functional group may include an amino group, an epoxy group, a hydroxy group, a mercapto group, a carboxyl group, a methacryloyl group, or an acryloyl group.

Content of the PDMS-based compound may be about 3% to about 20% by weight based on the total weight of the photocurable composition, for example, about 5% to about 10% by weight, but is not limited thereto. When the content of the PDMS-based compound in the photocurable composition is too small, required adhesive properties of the photosensitive layer 220 may not be obtained. When the content of the PDMS-based compound in the photocurable composition is too large, required adhesive properties of the photosensitive layer 220 may not be obtained.

The acrylate-based photocurable compound may reduce an adhesion strength of an exposed area of the photosensitive film 220 by participating in a photocuring reaction during exposure of the photosensitive film 220. The acrylate-based photocurable compound may include silicone acrylate, butyl acrylate, butyl methacrylate, hydroxyethyl acrylate, hydroxyethyl methacrylate, hydroxypropyl acrylate, hydroxypropyl methacrylate, isobornyl acrylate, dipentaerythritol hexa(meth)acrylate, dipentaerythritol penta(meth)acrylate, pentaerythritol tetra(meth)acrylate, ditrimethylolpropane tetra(meth)acrylrate, (meth)acrylate containing an oxyethylene group, ester (meth)acrylate, ether (meth)acrylate, epoxy (meth)acrylate, melamine (meth) acrylate, or a combination thereof. Content of the acrylate-based photocurable compound may be about 10% to about 60% by weight based on the total weight of the photocurable composition, for example, about 15% to about 50% by weight, but is not limited thereto. When the content of the acrylate-based photocurable compound in the photocurable composition is too small, desired flowability and flexibility of the photosensitive film 220 may not be secured. When the content of the acrylate-based photocurable compound in the photocurable composition is too large, desired adhesion property of the photosensitive film 220 may not be secured.

The photocurable composition may further include a photoinitiator.

The photoinitiator may induce a photocuring reaction in the exposure area of the photosensitive film 220. The photoinitiator may include a material capable of forming radicals by light irradiation. For example, the photoinitiator may include 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy) phenyl]-2-methyl-1-propanone, 2-hydroxy-1-{4-[4-(2-hydroxy-2-methyl-propionyl)-benzyl]-phenyl}-2-methyl-1-propan-1-one, 2-methyl-1-[4-(methylthio)phenyl]-2-morpholinopropan-1-one, 2-benzyl-2-dimethylamino-1-(4-morpholinophenyl)-butanone-1), 2-dimethylamino-2-(4-methyl-benzyl)-1-(4-morpholin-4-yl-phenyl)-butan-1-one), 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl)heptylideneamino]benzoate), [1-[9-ethyl-6-(2-methylbenzoyl)carbazol-3-yl]ethylideneamino] acetate, bis (2,4-cyclopentadienyl)bis[2,6-difluoro-3-(1-pyrryl)phenyl] titanium(IV)), or a combination thereof however, the photoinitiator is not limited to thereof.

The content of the photoinitiator is not particularly limited as long as the content is capable of sufficiently progressing photo polymerization or photocuring by exposure. In example embodiments, the photoinitiator may be included with an amount of about 0.1% to about 5% by weight, for example, about 0.5% to about 3% by weight, based on the total weight of the photocurable composition. When the content of the photoinitiator in the photocurable composition is too small, because sufficient curing in the exposure area of the photosensitive film 220 does not occur, it may be difficult to control the exposed area to have a required range of adhesion strength. When the content of the photoinitiator is too large in the photocurable composition, adhesion failure, cracking, and curling due to curing shrinkage may occur in the exposure area of the photosensitive film 220.

The photocurable composition may further include a solvent.

In example embodiments, the solvent may include an organic solvent. For example, the solvent may include methanol, ethanol, isopropanol, butanol, propylene glycol methoxy alcohol, methyl ethyl ketone, methyl butyl ketone, methyl isobutyl ketone, diethyl ketone, dipropyl ketone, methyl acetate, ethyl acetate, butyl acetate, propylene glycol methoxy acetate, methyl cellosolve, ethyl cellosolve, propyl cellosolve, normal hexane, normal heptane, benzene, toluene, xylene, or a combination thereof.

The content of the solvent is not particularly limited as long as the content is sufficient to dissolve the components included in the photocurable composition. In example embodiments, the content of the solvent may be about 10% to about 70% by weight based on the total weight of the photocurable composition. When the content of the solvent in the photocurable composition is too small, the viscosity of the photocurable composition may be excessively increased, and thus, coating properties and workability may be degraded. When the content of the solvent is too large in the photocurable composition, it may be difficult to secure a uniform thickness in the photosensitive film 220.

The photocurable composition may further include inorganic nanoparticles. The inorganic nanoparticles may improve mechanical properties such as abrasion resistance and scratch resistance of the photosensitive film 220 obtained from the photocurable composition.

In example embodiments, the inorganic nanoparticle may include $Al_2O_3$, $SiO_2$, ZnO, $ZrO_2$, $BaTiO_3$, $TiO_2$, $Ta_2O_5$, $Ti_3O_5$, indium-tin-oxide (ITO), indium-zinc-oxide (IZO), antimony-tin-oxide (ATO), ZnO—Al, $Nb_2O_3$, SnO, MgO, or a combination thereof, but the type of the inorganic nanoparticles is not limited thereto. The inorganic nanoparticle may have an average particle diameter of about 1 nm to about 100 nm, for example, about 5 nm to about 50 nm. When an average particle diameter of the inorganic nanoparticle is too small, aggregation of the inorganic nanoparticle may occur and uniformity of the photosensitive film 220 obtained from the photocurable composition may be deteriorated. When the average particle diameter of the inorganic nanoparticle is too large, optical and mechanical properties of the photosensitive film 220 obtained from the photocurable composition may be deteriorated.

The content of the inorganic nanoparticle may be about 5% to about 40% by weight based on the total weight of the photocurable composition. When the content of the inorganic nanoparticle in the photocurable composition is too small, it may be difficult to implement mechanical properties such as sufficient wear resistance and scratch resistance in the photosensitive film 220. When the content of the inorganic nanoparticle in the photocurable composition is too large, the inorganic nanoparticle may interfere with polymerization or curing of the photocurable compound in the subsequent process of exposing the photosensitive film 220, and thus mechanical properties may be deteriorated.

In example embodiments, the photocurable composition may further include an additive such as a leveling agent and an ultraviolet (UV) stabilizer.

The leveling agent may improve the smoothness and coating property of the photosensitive film 220. The leveling agent may include a silicone-based, fluorine-based, or acrylic polymer-based material. The content of the leveling agent may be about 0.1% to about 1% by weight based on the total weight of the photocurable composition.

The UV stabilizer may block or absorb UV rays, and thus may prevent the photosensitive film 220 formed by using the photocurable composition from being discolored or broken by exposure to the UV rays. The UV stabilizer may include phenyl salicylates, benzophenone, benzotriazole, nickel derivatives, radical scavengers, or a combination thereof. The content of the UV stabilizer may be about 0.1% to about 3% by weight based on the total weight of the photocurable composition.

In the process of forming the photosensitive film 220 on the support substrate 210 as illustrated in FIG. 4A, a coating process such as spin coating, spray coating, or dip coating may be performed. In example embodiments, the photosensitive film 220 may have a thickness of about 5 μm to about 100 μm. For example, the photosensitive film 220 may have a thickness of about 10 μm to about 20 μm.

Referring to FIG. 4B, some areas of the photosensitive film 220 may be exposed to induce a photocuring reaction. As a result, an adhesion layer 220A including a plurality of first areas AR1 and a plurality of second areas AR2, which have different adhesion strengths from each other, may be formed from the photosensitive film 220. The plurality of first areas AR1 and the plurality of second areas AR2 may be on one plane parallel to the main surface of the adhesion layer 220A.

Each of the plurality of first areas AR1, which are the exposure areas of the photosensitive film 220, may have approximately the same plane shape and the same planar size as the element area 112A of the package intermediate structure 110 illustrated in FIG. 2. The plurality of second areas AR2, which are non-exposure areas of the photosensitive film 220, may have approximately the same plane shape and the same planar size as the dummy area 112A of the package intermediate structure 110 illustrated in FIG. 2.

To expose some areas of the photosensitive film 220, a photomask 240 having a plurality of light transmitting areas LT and a plurality of light shielding areas LS on the photosensitive film 220 may be aligned to a certain position on the photosensitive film 220, and may be exposed through the plurality of light transmitting areas LT. UV light may be irradiated to expose the photosensitive film 220.

The photomask 240 may include a transparent substrate 242 and a light blocking pattern 244 formed on the transparent substrate 242. The plurality of light transmitting areas LT may be defined by the light blocking pattern 244 in the photomask 240. The transparent substrate 242 may include quartz, and the light blocking pattern 244 may include chromium (Cr), but is not limited thereto.

After some areas of the photosensitive film 220 are exposed, the photocrosslinkable material including the photosensitive film 220 may be photocured in the exposed plurality of first areas AR1, and the adhesion strength of the plurality of first areas AR1 may be less than that of the photosensitive film 220 before exposure, and accordingly, the adhesive strength of the plurality of first areas AR1 may be less than that of the second areas AR2, which are non-exposed areas. In example embodiments, in the adhesion layer 220A obtained after the exposure of the photosensitive film 220, the plurality of first areas AR1 may have a first adhesion strength of about 0.15 kgf/cm or less, for example, about 0.01 kgf/cm to about 0.15 kgf/cm. After the exposure of the photosensitive film 220, the second area AR2, which is the non-exposed area, may maintain the adhesion strength of the photosensitive film 220 before the exposure. In example embodiments, in the adhesion layer 220A obtained after the exposure of the photosensitive film 220, the second area AR2 may have a second adhesion strength, the second adhesion strength being greater than the first adhesion strength. The second adhesion strength of the second area AR2 may be between about 0.15 kgf/cm to about 1.5 kgf/cm, for example, about 0.2 kgf/cm to about 1.0 kgf/cm.

As illustrated in FIG. 4B, a resultant obtained by forming the adhesion layer 220A on the support substrate 210 may be part of the carrier substrate CS according to the technical idea of the inventive concept. On the carrier substrate CS, the adhesion layer 220A may include the plurality of first areas AR1 having the first adhesion strength and the plurality of second areas AR2 having the second adhesion strength, the second adhesion strength being greater than the first adhesion strength. In operation P20 in FIG. 1, the carrier substrate CS illustrated in FIG. 4B may be formed.

The carrier substrate CS formed by the method described with reference to FIGS. 4A and 4B may efficiently suppress a bending phenomenon of the package intermediate structure 110 when the carrier substrate is adhered to the package intermediate structure 110 illustrated in FIG. 2, in the process of manufacturing the semiconductor package, and may be easily peeled off by simply pulling the carrier substrate CS with a relatively weak force when detaching the carrier substrate CS from the package intermediate structure 110. In addition, after the carrier substrate CS is peeled from the package intermediate structure 110, the carrier substrate CS may be removed cleanly without leaving unwanted residue on the element area 112A of the package intermediate structure 110.

Referring again to FIG. 1, in the process P30, the package intermediate structure may be supported by the carrier substrate by adhering the package intermediate structure to the adhesion layer of the carrier so that the element area of the package intermediate structure faces the first area and the dummy area of the package intermediate structure faces the second area.

Figure 6A:
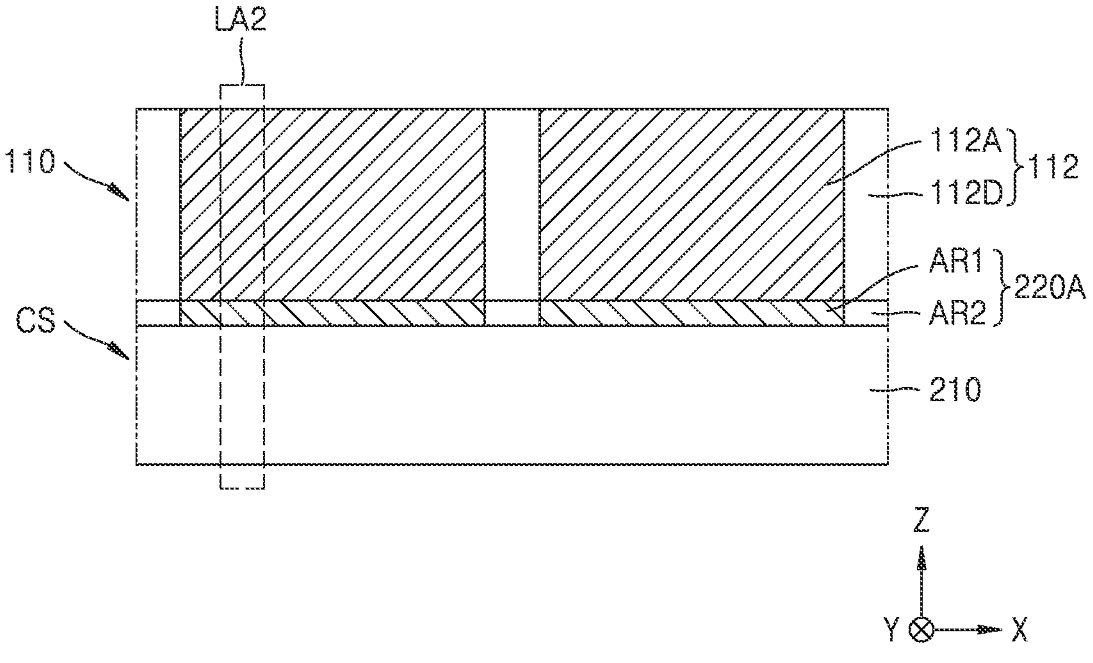
FIGS. 6A and 6B are cross-sectional views for describing a method of manufacturing a semiconductor package with particular examples, according to embodiments of the inventive concept.
Figure 6B:
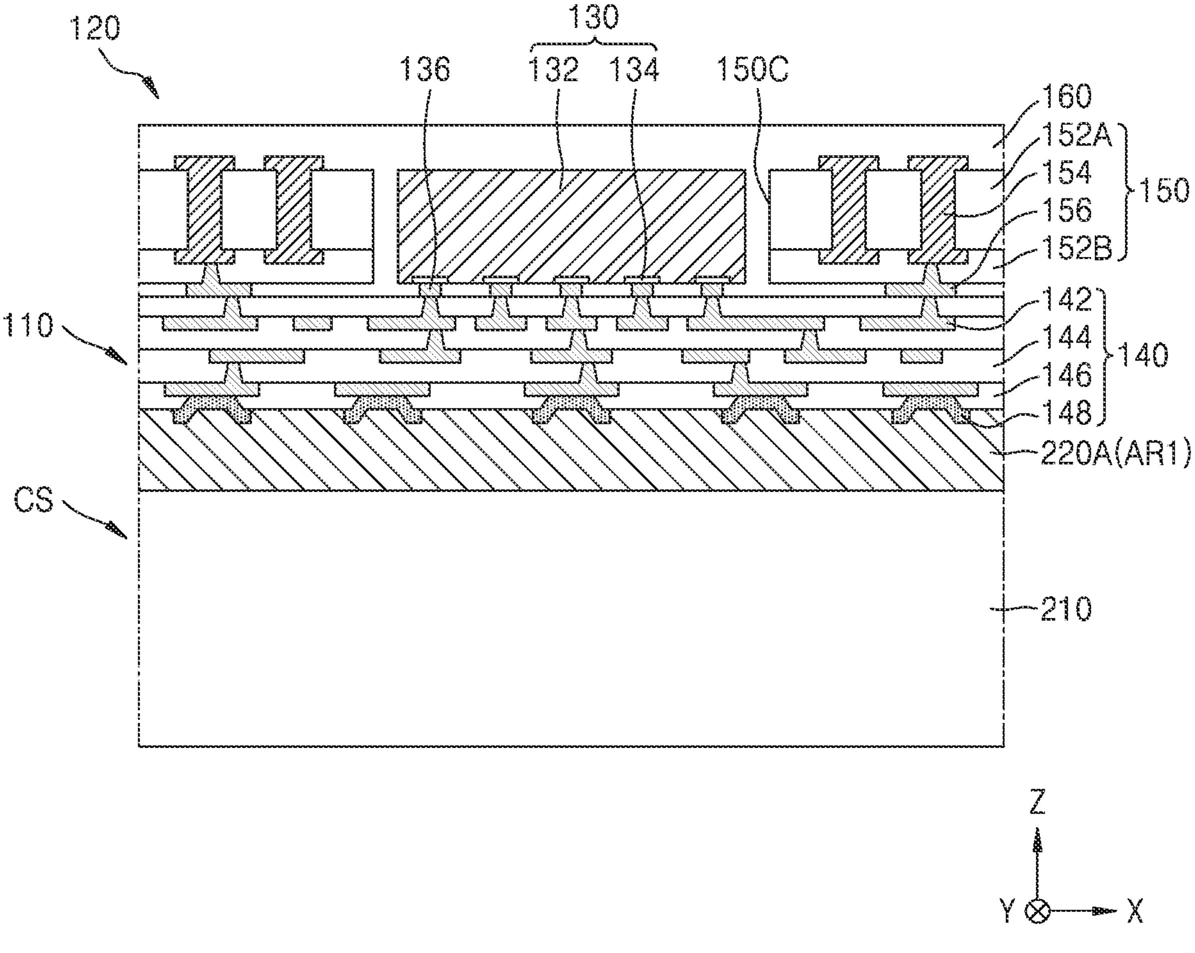

FIGS. 6A and 6B are cross-sectional views for explaining operation P30 in FIG. 1 as a particular example. FIG. 6A is a cross-sectional view illustrating a result of supporting the package intermediate structure 110 illustrated in FIG. 2 on the carrier substrate CS illustrated in FIG. 4B, and FIG. 6B is an enlarged cross-sectional view of a portion of the configuration of the local area LA2 in FIG. 6A.

Referring to FIGS. 6A and 6B, the package intermediate structure 110 may be supported by the carrier substrate CS by adhering the package intermediate structure 110 to the adhesion layer 220A of the carrier substrate CS so that the element area 112A of the package intermediate structure 110 faces the first area AR1, and the dummy area 112D of the package intermediate structure 110 faces the second area AR2.

As illustrated in FIG. 6B, the redistribution layer 140 of the unit package 120 in the element area 112A of the package intermediate structure 110 may be adhered to the first area AR1 of the adhesion layer 220A of the carrier substrate CS.

Because the first area AR1 of the adhesion layer 220A is photocured by exposure as described with reference to FIG. 4B and has a relatively weak first adhesion strength, the redistribution layer 140 of the unit package 120 may maintain a state in which the redistribution layer 140 is adhered relatively weakly to the first area AR1 of the adhesion layer 220A. Thus, when the adhesion layer 220A is removed from the redistribution layer 140 in a subsequent process, even though the first area AR1 of the adhesive layer 220A is pulled with a relatively weak force, the first area AR1 of the adhesive layer 220A AR1 may be easily peeled off. In addition, because the first area AR1 of the adhesion layer 220A is photocured by exposure, the content of the reactive materials may be reduced in the first area AR1, and thus it is possible to prevent the first area AR1 from forming an unnecessary chemical bond with a metal material exposed to the outside of the adhesion surface of the unit package 120, for example, the plurality of conductive pads 148. Accordingly, after the adhesion layer 220A is removed from the redistribution layer 140 in a subsequent process, unwanted residue may not remain on the surface of the redistribution layer 140. In addition, the first area AR1 of the adhesion layer 220A may be photocured by exposure, but flowability may be maintained. Thus, even when the adhesion surface of the unit package 120 is not flat, and the first area AR1 of the adhesion layer 220A is adhered to the adhesion surface of the unit package 120, materials of the adhesion layer 220A may be fluidly deformed so that there is no space left between the adhesion layer 220A and the package intermediate structure 110. Materials of the first area AR1 of the adhesion layer 220A may be fluidly deformed so that there is no space left between the redistribution layer 140 of the unit package 120 and the first area AR1. Thus, in a state where the unit package 120 is adhered to the first area AR1 of the adhesion layer 220A, there may not be unwanted gaps between the unit package 120 and the adhesion layer 220A.

The second area AR2 of the adhesion layer 220A may maintain the adhesion strength of the photosensitive film 220 before exposure. The second area AR2 of the adhesion layer 220A may have the second adhesion strength, the second adhesion strength being greater than the first adhesion strength. Thus, the dummy area 112D of the package intermediate structure 110 may be adhered relatively strongly to the second area AR2 of the adhesion layer 220A.

As described with reference to FIGS. 6A and 6B, in an operation of adhering the package intermediate structure 110 to the adhesion layer 220A of the carrier substrate CS, a thermal curing process may not be involved. Accordingly, because the process of applying heat when adhering the package intermediate structure 110 onto the carrier substrate CS may be omitted, the possibility of damage to the package intermediate structure 110 due to heat may be eliminated and thermal stability of the package intermediate structure 110 may be obtained. In addition, as illustrated in FIG. 6A, because the dummy area 112D of the package intermediate structure 110 is adhered relatively strongly to the second area AR2 of the adhesion layer 220A, and the package intermediate structure 110 is firmly supported by the carrier substrate CS while the package intermediate structure 110 is processed in a subsequent process in the state in which the package intermediate structure 110 is supported on the carrier substrate CS, the warpage phenomenon of the package intermediate structure 110 may be effectively suppressed by the carrier substrate CS.

Referring again to FIG. 1, in a process P40, the package intermediate structure may be processed in a state in which the package intermediate structure is supported by the carrier substrate.

Figure 7:
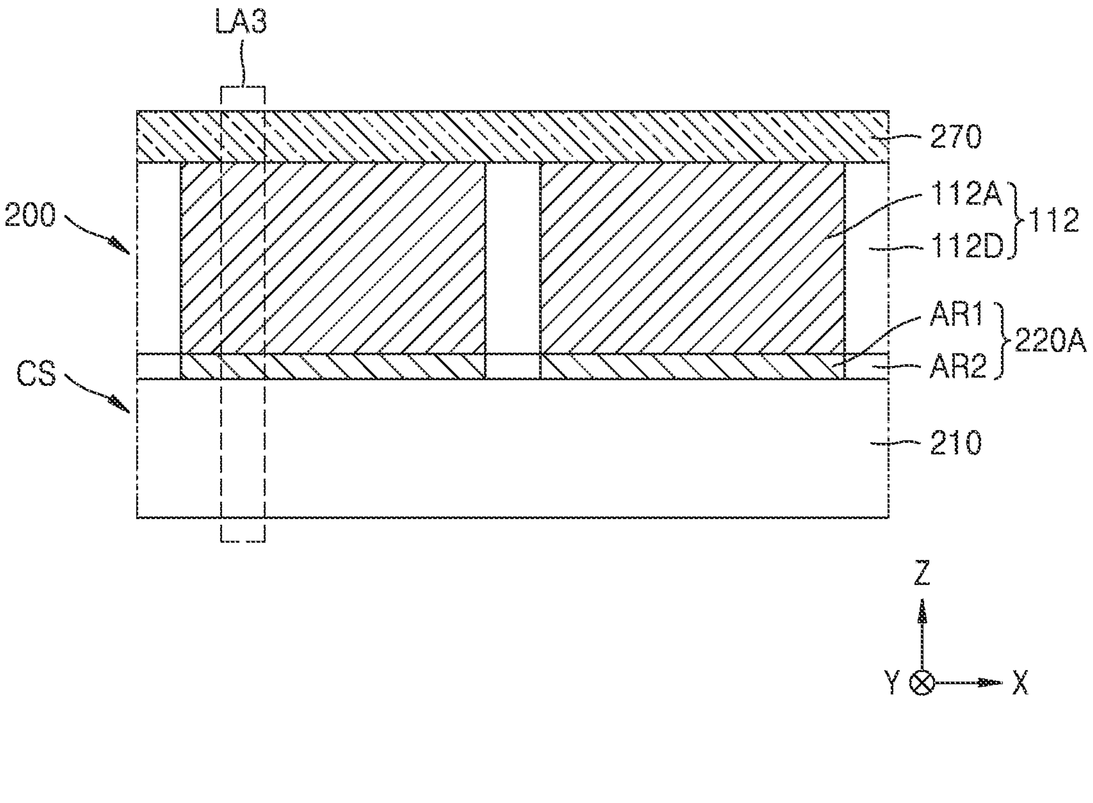
FIG. 7 is a cross-sectional view for describing a method of manufacturing a semiconductor package with a particular example, according to some embodiments of the inventive concept.

FIG. 7 is a cross-sectional view for explaining a particular example of the process P40 in FIG. 1.

Referring to FIG. 7, a package structure 200 may be formed by processing the package intermediate structure 110 from the result of FIG. 6A in which the package intermediate structure 110 is supported by the carrier substrate CS and by forming the backside structure 270 on the package intermediate structure 110.

FIGS. 8A through 8D are detailed cross-sectional views illustrating a process of forming the package structure 200 including the backside structure 270 as illustrated in FIG. 7, by using particular examples. In FIGS. 8A through 8D, some areas corresponding to a local area LA3 in FIG. 7 are enlarged and illustrated.

Figure 8A:
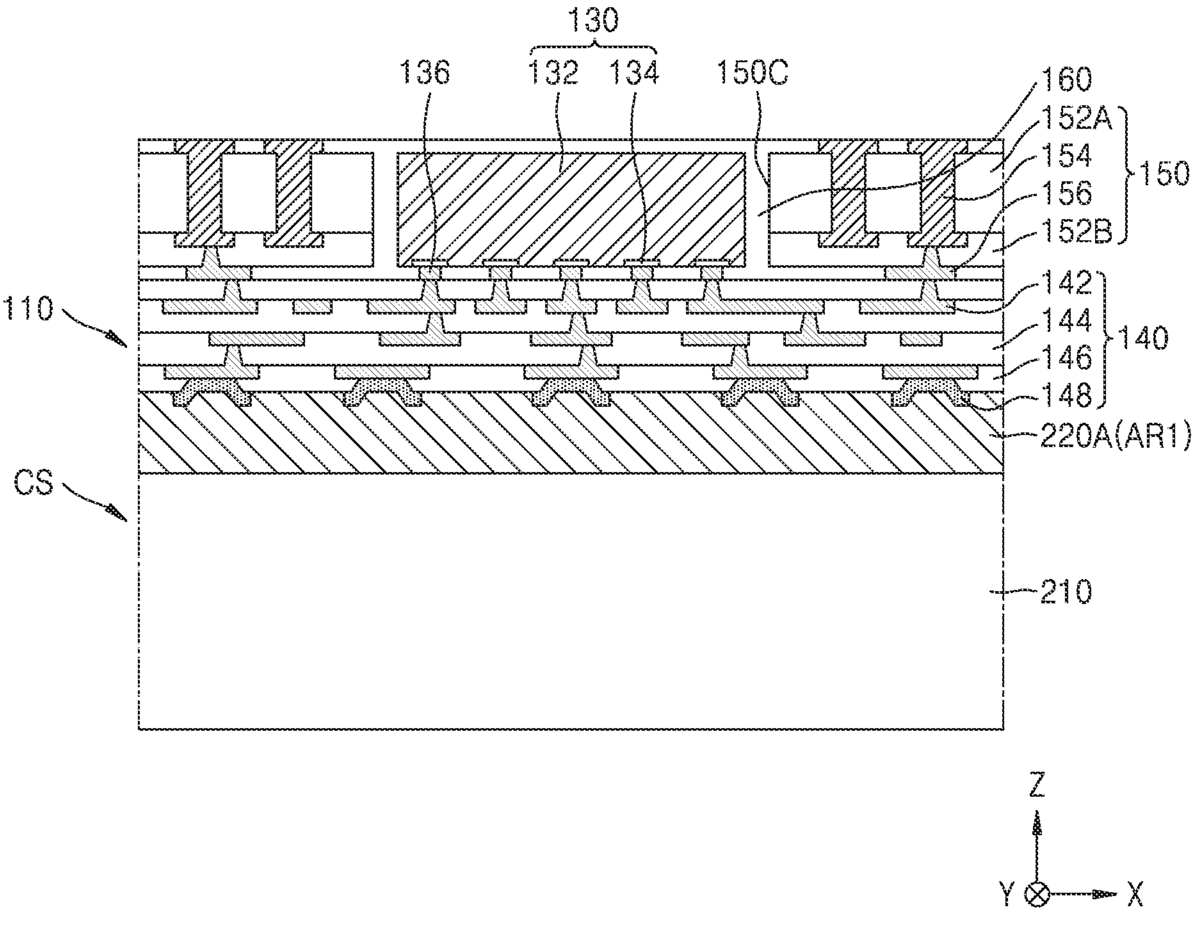
FIGS. 8A to 8D are cross-sectional views illustrating a process of forming a package structure including a backside structure in a semiconductor package manufacturing method according to a process sequence, according to embodiments of the inventive concept.

Referring to FIG. 8A, while the package intermediate structure 110 is supported by the carrier substrate CS, an upper surface of the circuit substrate 150, for example, an upper surface of the plurality of via contact structures 154, may be exposed by etching a portion of an upper side of the sealing layer 160. In example embodiments, a wet etching process may be used to etch a portion of the upper side of the sealing layer 160.

Figure 8B:
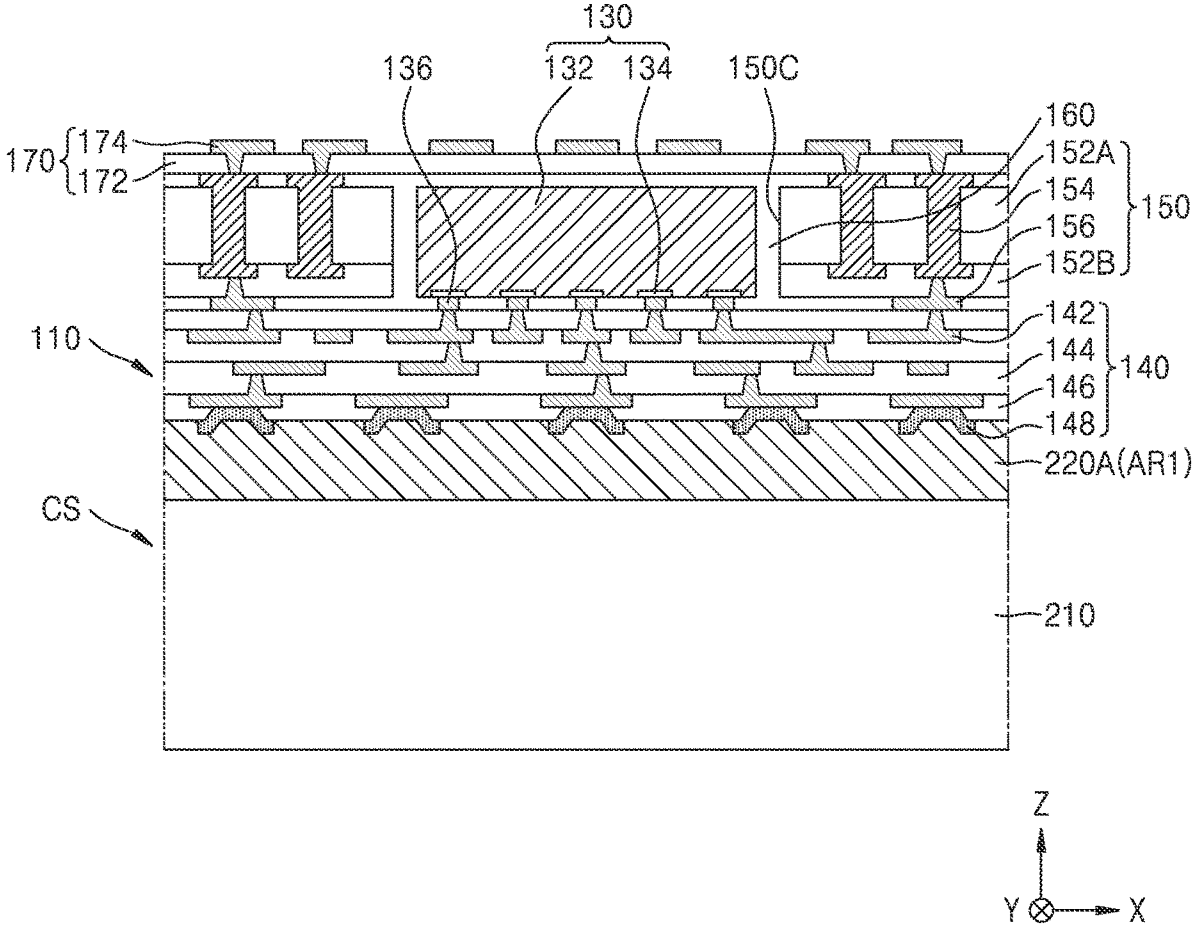

Referring to FIG. 8B, the backside insulating layer 172 may be formed on the sealing layer 160 and the circuit substrate 150, and a plurality of backside conductive patterns 174 penetrating the backside insulating layer 172 and connected to the plurality of via contact structures 154 may be formed. The backside insulating layer 172 and the plurality of backside conductive patterns 174 may be included in the backside redistribution layer 170.

In example embodiments, the backside insulating layer 172 may include a photoimageable dielectric material, but is not limited thereto. The plurality of backside conductive patterns 174 may include Cu, Au, Ag, Ni, W, Al, or a combination thereof. The plurality of backside conductive patterns 174 may further include a barrier layer. The barrier layer may include Ti, Ta, TiN, TaN, or a combination thereof.

Figure 8C:
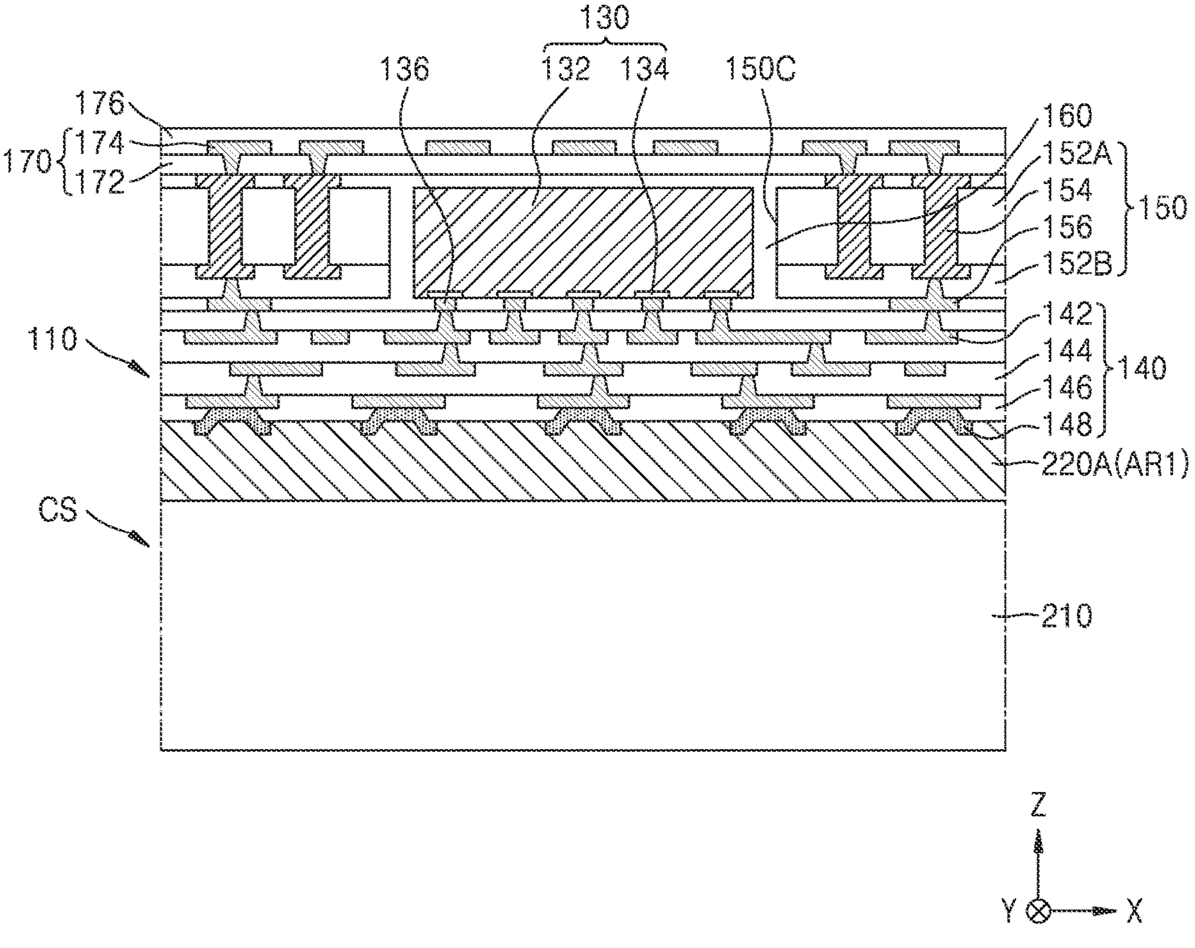

Referring to FIG. 8C, a protective layer 176 covering the backside redistribution layer 170 may be formed from the result of FIG. 8B. In example embodiments, the protective layer 176 may include solder resist.

Figure 8D:
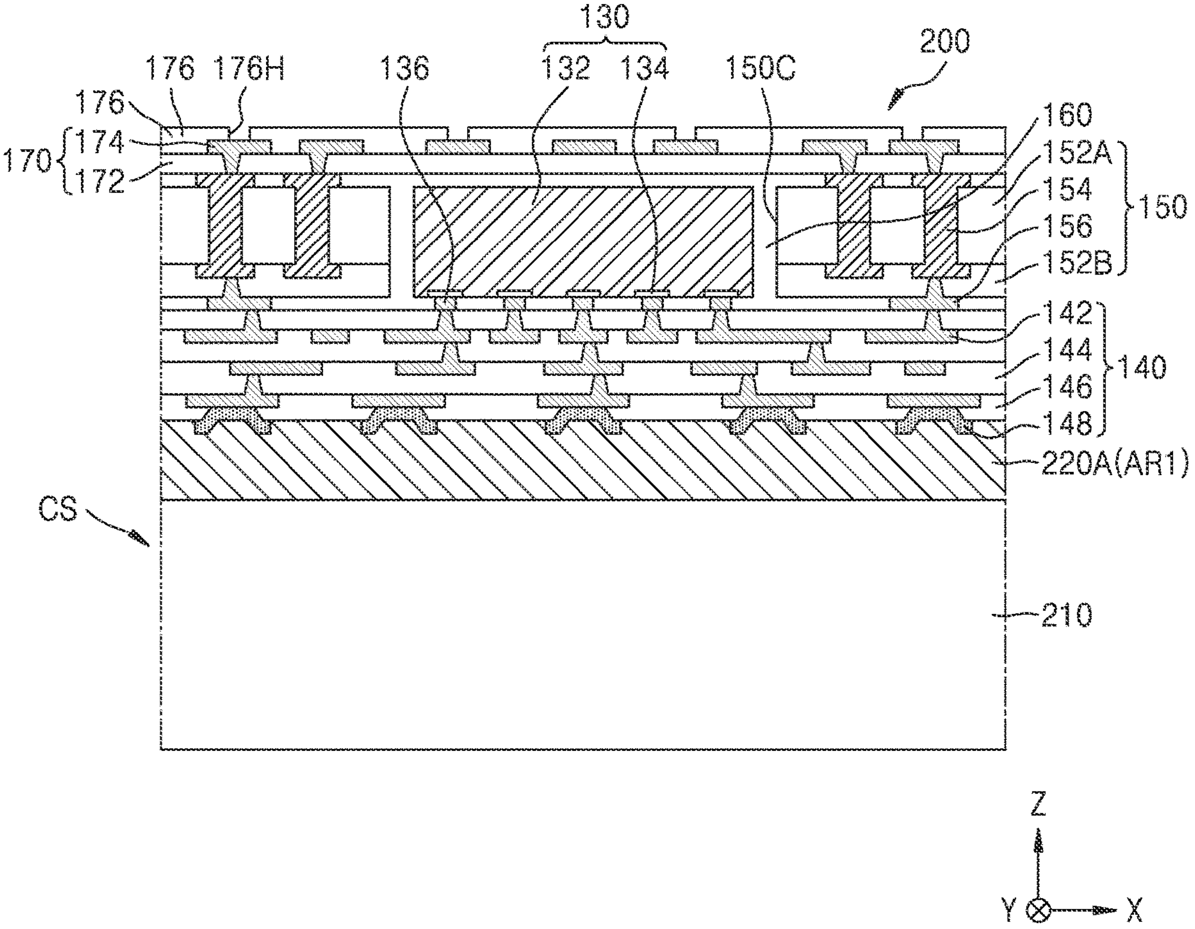

Referring to FIG. 8D, a plurality of openings 176H exposing portions of the plurality of backside conductive patterns 174 may be formed on the protective layer 176 by etching a portion of the protective layer 176 from the result of FIG. 8C.

From the result of FIG. 8D, the backside redistribution layer 170 and the protective layer 176 may be included in the backside structure 270 illustrated in FIG. 7.

As described with reference to FIGS. 7 and 8A through 8D, the package structure 200 including the backside structure 270 may be formed by processing the package intermediate structure 110. In forming the package structure 200, the package intermediate structure 110 may be supported by the carrier substrate CS while being adhered to the adherence layer 220A of the carrier substrate CS. While the backside structure 270 is formed, each of the plurality of element areas 112A of the package intermediate structure 110 may be adhered to the first area AR1 of the adhesion layer 220A having the first adhesion strength of a relatively small magnitude, and each of the plurality of dummy areas 112D of the package intermediate structure 110 may be adhered to the second area AR2 of the adhesion layer 220A having the second adhesion strength, the second adhesion strength being greater than the first adhesion strength. Accordingly, the warpage phenomenon of the package intermediate structure 110 during the formation operation of the backside structure 270 may be effectively suppressed by the carrier substrate CS. Thus, fine patterns required to form the backside redistribution layer 170 constituting the backside structure 270 may be easily formed.

FIGS. 9A through 9E are cross-sectional views illustrating a method of manufacturing a semiconductor package according to a process sequence, according to other embodiments of the inventive concept. In FIGS. 9A through 9E, the case in which the support substrate 210B illustrated in FIG. 5B is applied as the support substrate 210 illustrated in FIG. 7 is described as an example.

Figure 9A:
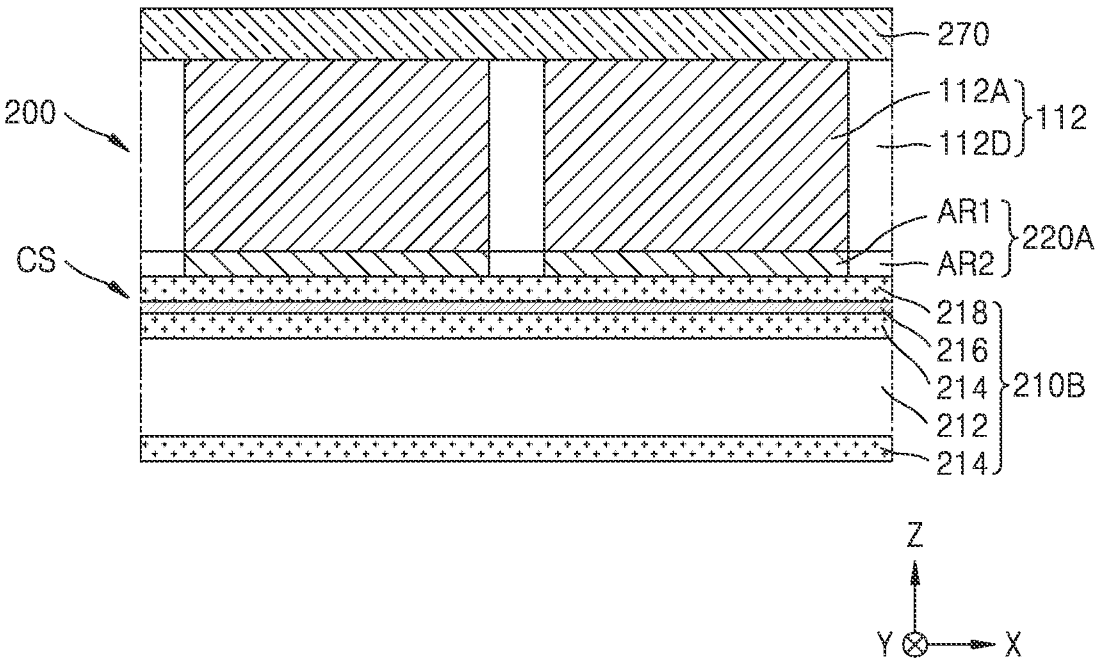
FIGS. 9A through 9E are cross-sectional views illustrating a method of manufacturing a semiconductor package according to a process sequence, according to some embodiments of the inventive concept.

Referring to FIG. 9A, after the process P10, the process P20, and the process P30 in FIG. 1 are performed, in the state in which the package intermediate structure 110 (refer to FIG. 2) is supported on the carrier substrate CS including the support substrate 210B and the adhesion layer 220, the package structure 200 may be formed by processing the package intermediate structure 110 according to the process P40 in FIG. 1 as described with reference to FIG. 7 and FIGS. 8A through 8D.

Figure 9B:
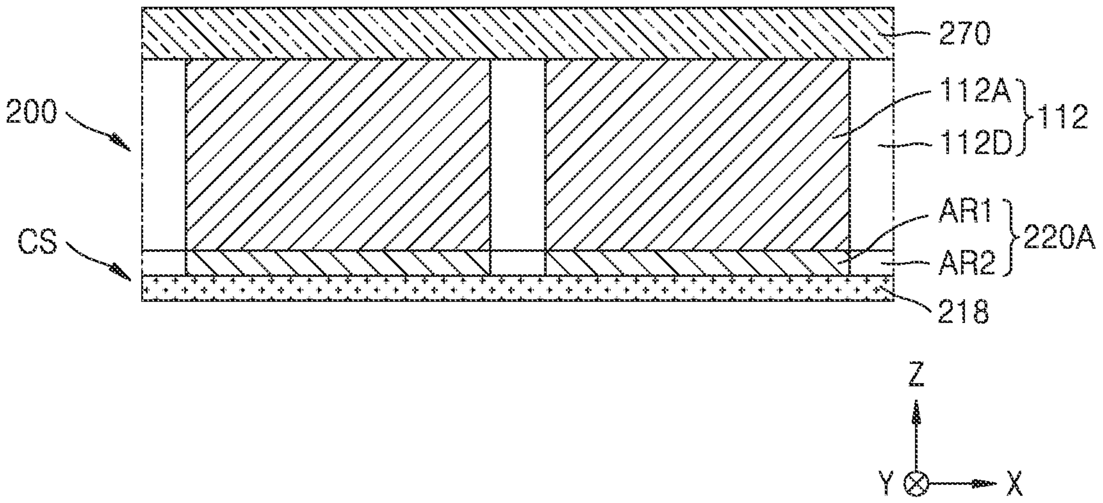

Referring to FIG. 9B, the metal layer 218 of the support substrate 210B may be exposed by removing the CCL structure including the core insulating layer 212 and the copper layer 214 among the support substrate 210B from the result of FIG. 9A by using the release layer 216. As a result, only the metal layer 218 and the adhesion layer 220A of the carrier substrate CS may remain on the package structure 200.

Figure 9C:
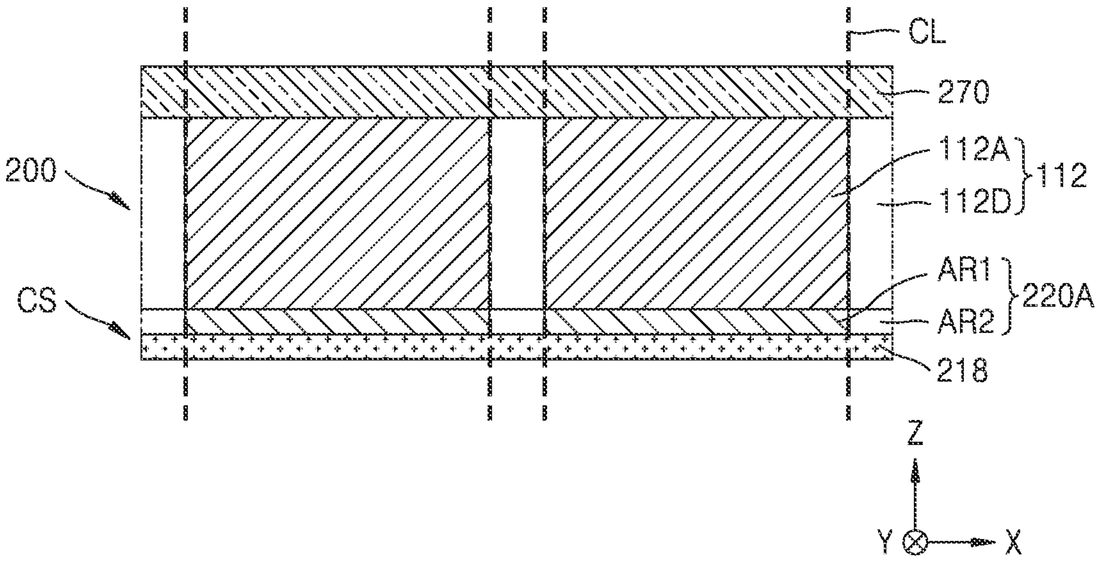

Referring to FIG. 9C, the dummy area 112D may be removed from the package structure 200 by performing a cutting process along a cut line CL indicated as a dashed line with respect to the result of FIG. 9B. As a result, the dummy area 112D and the second area AR2 of the adhesion layer 220A adhered to the dummy area 112D, and a portion covering the second area AR2 among the metal layer 218 may be removed. In example embodiments, the cutting process may be performed by using a sawing blade.

Figure 9D:
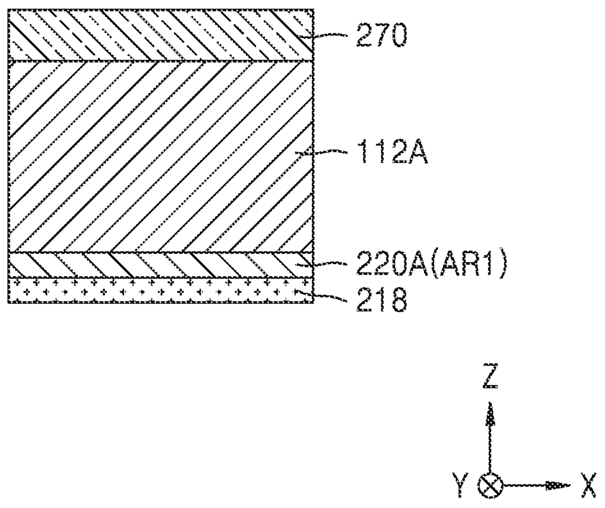

FIG. 9D is a cross-sectional view illustrating one element area 112A of the plurality of element areas 112A separated after the cutting process described with reference to FIG. 9C is performed. After the cutting process described with reference to FIG. 9C is performed, the first area AR1 of the adhesion layer 220A may remain adhered to the element area 112A. In example embodiments, the metal layer 218 may remain on the first area AR1 of the adhesion layer 220A. In other example embodiments, unlike as illustrated in FIG. 9D, the metal layer 218 covering the first area AR1 of the adhesion layer 220A may be removed together with the dummy area 112D due to the relatively weak adhesion strength of the first area AR1 in the cutting process described with reference to FIG. 9C.

Figure 9E:
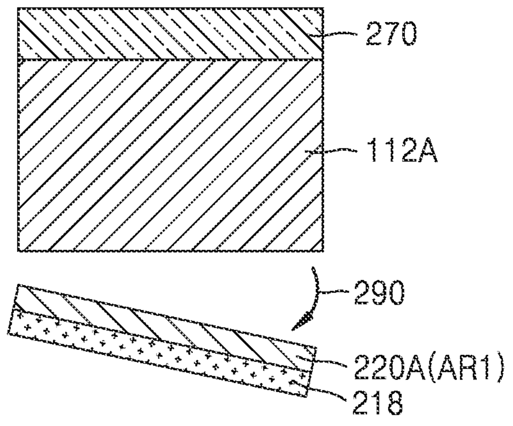

Referring to FIG. 9E, the first area AR1 and the metal layer 218 of the adhesion layer 220A may be separated from the element area 112A in the result of FIG. 9D.

Because the first area AR1 of the adhesion layer 220A is photocured by exposure as described with reference to FIG. 4B and has a relatively weak first adhesion strength, the first area AR1 of the adhesion layer 220A may be easily separated from the element area 112A by applying a relatively weak physical force to the first area 112A of the adhesion layer 220A and pulling the first area AR1 of the adhesion layer 220A in a direction of an arrow 290 to separate the first area AR1 of the adhesion layer 220A from the element area 112A. Accordingly, complicated processes used in the existing process for separating the first area AR1 of the adhesion layer 220A from the element area 112A, for example, an etching process of the metal layer 218, a laser ablation process for removing the adhesive layer formed of a conventional thermosetting resin, a desmear process for removing residues of the conventional thermosetting resin by using chemicals, and the like may be omitted, and thus the first area AR1 of the adhesion layer 220A may be separated from the device area 112A in a simple process.

In example embodiments, when the supporting substrate 210A illustrated in FIG. 5A is applied as the supporting substrate 210, the process described with reference to FIG. 9B may be omitted, and the cutting process described with reference to FIG. 9C may be performed in a state in which the supporting substrate 210A is adhered onto the package structure 200.

In example embodiments, after the first area AR1 of the adhesion layer 220A is separated from the element area 112A, the exposed surface of the element area 112A may be cleaned. In example embodiments, after the process of FIG. 9E is performed, a process of forming an external connection terminal on the exposed surface of the element area 112A may be performed.

FIG. 10 is a cross-sectional view illustrating the result of forming the plurality of external connection terminals 190 connected to the plurality of conductive pads 148, after exposing the plurality of conductive pads 148 by removing the carrier substrate CS in a similar method to the method described with reference to FIGS. 9B through 9E with respect to the result of FIG. 8D.

In example embodiments, the plurality of external connection terminals 190 may be formed by using solder balls. The plurality of external connection terminals 190 may include tin (Sn), lead (Pb), silver (Ag), copper (Cu), or a combination thereof. The plurality of external connection terminals 190 may connect the package structure 200 to a circuit substrate, another semiconductor package, an interposer, or a combination thereof.

Figure 11:
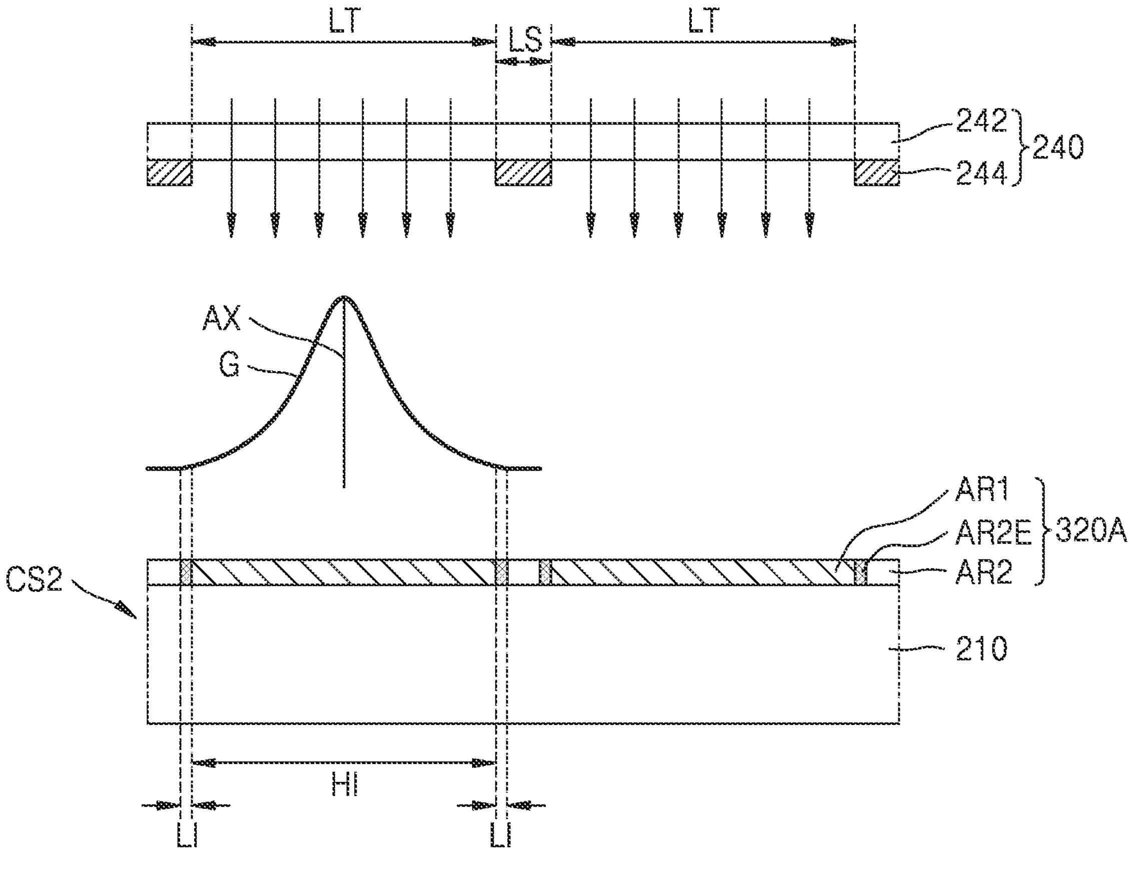
FIG. 11 is a cross-sectional view illustrating a method of forming a carrier substrate according to a method of manufacturing a semiconductor package, according to some embodiments of the inventive concept.

FIG. 11 is a cross-sectional view illustrating a method of forming a carrier substrate CS2, according to other embodiments of the inventive concept.

Referring to FIG. 11, substantially the same method as described with reference to FIGS. 4A and 4B may be used to form the carrier substrate CS2 according to process P20 in FIG. 1. However, in the present example, the carrier substrate CS2 may be formed instead of the carrier substrate CS1 illustrated in FIG. 4B.

The carrier substrate CS2 may include the support substrate 210 and an adhesion layer 320A stacked on the support substrate 210. To form the adhesion layer 320A, the photosensitive film 220 illustrated in FIG. 4A may be exposed in a similar manner to that described with reference to FIG. 4B. However, the adhesion layer 320A may be formed during the exposure process. The adhesion layer 320A may include the first area AR1, the second area AR2, and plurality of second area edge portions AR2E, each having different adhesion strengths from each other by adjusting the intensity of the light beam irradiated during the exposure process. The plurality of second area edge portions AR2E may be partial areas surrounding the plurality of first areas AR1, among the second areas AR2.

The plurality of first areas AR1, which are the exposure areas, may have the first adhesion strength within a range of less than or equal to about 0.15 kgf/cm, for example, within a range of about 0.01 kgf/cm to about 0.15 kgf/cm. The second area AR2, which is not the exposure area, may have the second adhesion strength, the second adhesion strength being greater than the first adhesion strength. The second adhesion strength of the second area AR2 may be between about 0.15 kgf/cm to about 1.5 kgf/cm, for example, about 0.2 kgf/cm to about 1.0 kgf/cm. The plurality of second area edge portions AR2E may have a third adhesion strength being greater than the first adhesion strength and less than the second adhesion strength. In example embodiments, in each of the plurality of second area edge portions AR2E, the adhesion strength thereof may gradually increase as the second area edge portion AR2E approaches the second area AR2 from the first area AR1. In example embodiments, the third adhesion strength of the plurality of second area edge portions AR2E may have a range of about 0.15 kgf/cm to about 1.0 kgf/cm, for example, a range of about 0.2 kgf/cm to about 0.5 kgf/cm.

To form the adhesion layer 320A including the first area AR1, the second area AR2, and the second area edge portion AR2E, which have different adhesion strengths from each other, some portions selected from the photosensitive film 220 may be exposed by using a method similar to that described with reference to FIG. 4B. In this case, a Gaussian beam may be irradiated to the photosensitive film 220 (refer to FIG. 4A) through the photomask 240 by adjusting the intensity of the light beam irradiated during the exposure process. The light beam irradiated to the photosensitive film 220 (refer to FIG. 4A) through the photomask 240 may be axially symmetric with respect to an optical axis AX, and current density distribution, as indicated by G, may have a Gaussian distribution. Accordingly, as a position of the light beam moves away from the optical axis AX, the intensity of the light beam may be rapidly reduced. The plurality of first areas AR1, which are exposure areas of the adhesion layer 320A obtained after the exposure of the photosensitive film 220 (refer to FIG. 4A), may correspond to a high-intensity area HI having a relatively high exposure light intensity among the Gaussian beams. The plurality of second area edge portions AR2E of the adhesion layer 320A may correspond to a low intensity area LI having a relatively low exposure light intensity among the Gaussian beams. Accordingly, even though photopolymerization reaction is performed in the plurality of second area edge portions AR2E, the photopolymerization reaction may not be sufficiently performed compared with the plurality of first areas AR1. Thus, the plurality of second area edge portions AR2E may have the third adhesion strength being greater than the first adhesion strength and less than the second adhesion strength.

Figure 12:
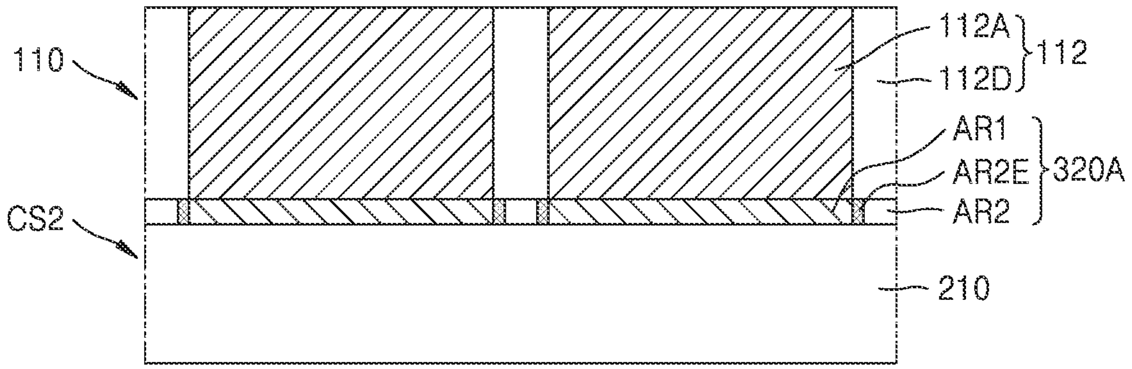
FIG. 12 is a cross-sectional view illustrating a result in which a package intermediate structure is supported on a carrier substrate according to a method of manufacturing a semiconductor package, according to some embodiments of the inventive concept.

FIG. 12 is a cross-sectional view illustrating a result of supporting the package intermediate structure 110 illustrated in FIG. 2 on the carrier substrate CS2 illustrated in FIG. 11.

While the package intermediate structure 110 is supported on the carrier substrate CS2, the element area 112A of the package intermediate structure 110 may face the first area AR1 of the adhesion layer 320A of the carrier substrate CS2, and the dummy area 112D of the package intermediate structure 110 may face the second area AR2 and the plurality of second area edge portions AR2E of the adhesion layer 320A of the carrier substrate CS2.

The processes described with reference to the process P40 in FIG. 1 and with reference to FIGS. 7, 8A through 8D, and 9A through 9E, or similar processes may be performed by using the result of FIG. 12, and thus the same or similar effects as described with reference to the process P40, FIGS. 7, 8A through 8D, and 9A through 9E may be obtained.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor package, the method comprising:

forming a package intermediate structure comprising an element area and a dummy area;

forming a carrier substrate comprising an adhesion layer, wherein the adhesion layer comprises a first area with a first adhesion strength and a second area with a second adhesion strength that is different from the first adhesion strength;

supporting the package intermediate structure by using the carrier substrate by contacting the package intermediate structure to the adhesion layer so that the element area is adjacent the first area and the dummy area is adjacent the second area; and processing the package intermediate structure when the package intermediate structure is supported by the carrier substrate to reduce warpage of the package intermediate structure, wherein the forming of the carrier substrate comprises:

forming a photosensitive film on a support substrate; and forming the adhesion layer by photocuring a portion of the photosensitive film.

2. The method of claim 1, wherein the forming of the photosensitive film comprises coating a photocurable compound comprising a polydimethylsiloxane (PDMS)-based compound and an acrylate-based photocurable compound on a support substrate; and wherein the forming of the adhesion layer comprises exposing the portion of the photosensitive film to UV light to form the first area of the adhesion layer on an exposed area of the photosensitive film and to form the second area of the adhesion layer on a non-exposed area of the photosensitive film, wherein a light beam of the UV light irradiated to the photosensitive film is axially symmetric with respect to an optical axis of the exposed area of the photosensitive film.

3. The method of claim 1, wherein the package intermediate structure comprises a square panel, and wherein the dummy area comprises a square grid mesh-shaped unit around the element area on the square panel in a plan view.

4. The method of claim 1, wherein the element area of the package intermediate structure comprises a plurality of unit packages, and wherein the plurality of unit packages comprise:

a circuit board comprising a cavity;

a semiconductor chip in the cavity; and a redistribution layer overlapping the semiconductor chip in a vertical direction.

5. The method of claim 1, wherein the processing of the package intermediate structure comprises forming a backside redistribution layer on the package intermediate structure, and wherein the warpage of the package intermediate structure during the forming the backside redistribution layer is reduced by support from the carrier substrate.

6. A method of manufacturing a semiconductor package, the method comprising:

forming a package intermediate structure comprising a plurality of element areas and a dummy area around a periphery of ones of the plurality of element areas;

forming a carrier substrate comprising a support substrate and an adhesion layer on the support substrate, wherein the adhesion layer comprises a plurality of first areas with a first adhesion strength and a second area with a second adhesion strength, and wherein the second adhesion strength is greater than the first adhesion strength;

supporting the package intermediate structure by using the carrier substrate by adhering the package intermediate structure to the adhesion layer so that the plurality of element areas are adjacent the plurality of first areas and the dummy area is adjacent the second area; and forming a package structure by processing the package intermediate structure when the package intermediate structure is supported by the carrier substrate, wherein, in the forming of the carrier substrate, the adhesion layer further comprises a second area edge portion between one first area selected from the plurality of first areas and the second area, and wherein the second area edge portion has a third adhesion strength, wherein the third adhesion strength is greater than the first adhesion strength and less than the second adhesion strength.

7. The method of claim 6, wherein the forming of the carrier substrate comprises:

forming a photosensitive film on the support substrate by coating a photocurable compound comprising a polydimethylsiloxane (PDMS)-based compound and an acrylate-based photocurable compound on the support substrate; and forming the adhesion layer by exposing the plurality of element areas to UV light so that a photopolymerization reaction occurs in a plurality of areas of the photosensitive film.

8. The method of claim 7, wherein the photocurable compound comprises PDMS and silicon acrylate.

9. The method of claim 6, wherein the third adhesion strength of the second area edge portion gradually increases as the second area edge portion approaches the second area from the one first area selected from the plurality of first areas.

10. The method of claim 6, wherein the forming of the package structure comprises forming a backside redistribution layer on the package intermediate structure, and wherein warpage of the package intermediate structure during the forming the backside redistribution layer is reduced by support from the carrier substrate.

11. The method of claim 6, after the forming of the package structure, further comprising:

removing at least a portion of the support substrate from the package structure;

removing the dummy area and the second area of the adhesion layer adhered to the dummy area from the package structure by cutting the package structure when the adhesion layer is adhered to the package structure; and removing the plurality of first areas of the adhesion layer adjacent to the plurality of element areas.

12. A method of manufacturing a semiconductor package, the method comprising:

forming a photosensitive film on a support substrate;

forming an adhesion layer comprising a first area comprising an exposed area of the photosensitive film and a second area comprising a non-exposed area of the photosensitive film by exposing a portion of the photosensitive film to UV light;

adhering a package intermediate structure comprising an element area and a dummy area to the adhesion layer so that the element area is adjacent the first area and the dummy area is adjacent the second area;

forming a package structure from the package intermediate structure by forming a backside structure on the package intermediate structure when the package intermediate structure is supported by the support substrate and the adhesion layer;

removing the dummy area from the package structure by cutting the package structure and the adhesion layer when the adhesion layer is adhered to the element area and the dummy area; and removing the adhesion layer from the element area.

13. The method of claim 12, wherein the forming of the photosensitive film comprises coating a photocurable composition comprising a polydimethylsiloxane (PDMS)-based compound and an acrylate-based photocurable compound onto the support substrate.

14. The method of claim 12, wherein, when forming the photosensitive film, the photosensitive film has a thickness of about 5 μm to about 100 μm.

15. The method of claim 12, wherein the adhesion layer is formed so that the first area has a first adhesion strength in a range of about 0.01 kgf/cm to about 0.15 kgf/cm, and the second area has a second adhesion strength, and wherein the second adhesion strength is greater than the first adhesion strength and is in a range of about 0.15 kgf/cm to 1.5 kgf/cm.

16. The method of claim 12, wherein the adhesion layer further comprises a second area edge portion between the first area and the second area, wherein the first area has a first adhesion strength in a range of about 0.01 kgf/cm to about 0.15 kgf/cm, wherein the second area has a second adhesion strength, wherein the second adhesion strength is greater than the first adhesion strength, wherein the second area edge portion has a third adhesion strength, and wherein the third adhesion strength is greater than the first adhesion strength and less than the second adhesion strength.

17. The method of claim 12, wherein the element area of the package intermediate structure comprises a plurality of unit packages, and the plurality of unit packages comprise a circuit board comprising a cavity and a semiconductor chip accommodated in the cavity, and wherein the forming of the package structure comprises forming a backside redistribution layer on the semiconductor chip.

18. The method of claim 12, wherein the support substrate comprises a core insulating layer, and a copper clad laminated (CCL) structure comprising a copper layer on both side surfaces of the core insulating layer.

* * * * *